United States Patent [19]
Gesley

[11] Patent Number: 5,276,330
[45] Date of Patent: Jan. 4, 1994

[54] HIGH ACCURACY BEAM BLANKER
[75] Inventor: Mark Gesley, Oakland, Calif.
[73] Assignee: Etec Systems, Inc., Hayward, Calif.
[21] Appl. No.: 706,612
[22] Filed: May 29, 1991
[51] Int. Cl.$^5$ .......................................... H01J 37/147
[52] U.S. Cl. .................. 250/396 R; 313/361.1
[58] Field of Search ..................... 250/310, 396; 313/361.1

[56] References Cited

U.S. PATENT DOCUMENTS

| | | | |
|---|---|---|---|
| 3,676,693 | 7/1972 | Guernet | 250/396 R |
| 4,169,229 | 9/1979 | Feuerbaum | 250/396 R |
| 4,409,487 | 10/1983 | Kuschel et al. | 250/396 R |
| 4,445,041 | 4/1984 | Kelly et al. | 250/396 R |
| 4,507,559 | 3/1985 | Plies | 250/396 R |
| 4,560,878 | 12/1985 | Knauer et al. | 250/398 |

FOREIGN PATENT DOCUMENTS

| | | | |
|---|---|---|---|
| A20262855 | 4/1986 | European Pat. Off. | 37/04 |
| 1598867 | 9/1981 | United Kingdom | 37/147 |
| A2099626 | 12/1982 | United Kingdom | 29/02 |

OTHER PUBLICATIONS

Journal of Vacuum Science and Technology: Part B. vol. 8, No. 6, Nov. 1990, New York US pp. 1666-1672; M. Gesley and P. Condran: "Electron Beam Blanker Optics" *abstract* p. 1667, left column, paragraph 2- p. 1668, left column, paragraph 1* p. 1669, left column, paragraph 4- right column, paragraph 2* p. 1671, right column, paragraph 3 - paragraph 4; figures 1,2*.
Patent Abstracts of Japan vol. 14, No. 429 (E-978) 14 Sep. 1990 & JP-A-2 165 549 (JEOL Ltd.) 26 Jun. 1990 *abstracts*.

Primary Examiner—Bruce C. Anderson
Attorney, Agent, or Firm—Skjerven, Morrill MacPherson Franklin & Friel

[57] ABSTRACT

The accuracy of a double-deflection beam blanker is dramatically improved for all blanker voltages by using provided, closed-form, trajectory equations to determine the blanker geometric parameters and compensating for fringe-field effects in order to precisely determine the delay line length for control of an electron or ion beam. This delay line length is maintained by placing alignment apertures above and below the blanker.

6 Claims, 9 Drawing Sheets

HIGH ACCURACY BEAM BLANKER

FIELD OF THE INVENTION

This invention relates to a method of improving electron or ion beam blanker accuracy and in particular, to a method and an improved beam blanker that reduces the movement per applied force on the charged particle beam by using geometric parameters derived from closed set equations, and compensating for fringe field effects.

BACKGROUND OF THE INVENTION

The beam blanker is an integral component of electron optical columns dedicated to chip and mask lithography, circuit testing and inspection, and other applications where a charged particle beam must be rapidly turned off and on at a target plane (i.e., the surface of a substrate). A typical beam blanker 1 is shown in FIG. 1. A steady state voltage applied to beam blanker 1, comprising two identical vertically aligned U-shaped plates 2 spaced apart by distance 3, produces an electric field transverse to a beam axis 4. This field deflects the electrons or ions (which comprise the beam emanating from beam source 11) off-axis away from aperture 5 causing the electrons or ions to become embedded in beam stop 6, thereby stopping any beam current from being transmitted past beam stop 6.

However, the applied blanker voltage is, in fact, time dependent, i.e. the voltage is varied during the transition between the beam "on" and "off" states. This variation in blanker voltage during the transition, coupled with the beam transit for those electrons passing through aperture 5 results in undesirable motion at the target 26.

Various structures have been proposed to eliminate the problem of beam jitter. For example, U.S. Pat. No. 4,445,041 (hereinafter the '041 reference) discloses a double deflection blanker (see FIG. 1) in which the bottom halves 9 of plates 2 deflect the electrons which have passed through aperture 5. This second deflection of the electrons attempts to compensate for this time-dependent blanker voltage by creating a steady state voltage effect, thereby minimizing the beam jitter.

However, this reference describes solely an operation of the beam blanker at a 20kV beam voltage. An extension of this prior art disclosure to other beam voltages results in serious degradation in performance. Therefore, a need arises for a beam blanker which operates within the positional accuracy range at all times, for all beam voltages.

SUMMARY OF THE INVENTION

In accordance with the invention, an improved blanker includes a delay line length which is a function of a predetermined voltage. Optimal delay line length minimizes beam jitter and compensates for fringe-field effects. Specifically, closed-form trajectory equations are derived in accordance with the present invention to provide an exact understanding of the operation and interaction of the blanker geometry, blanker voltage, and beam in order to provide the optimal delay line length. These equations describe the electron-optical mechanics of the beam-blanker interaction and provide the means to determine the optimum geometric parameters and hence performance for the blanker. Also, with these equations, voltage effects such as ringing, overshoot, and rise and fall time of the blanker can be precisely determined.

The reduction in blanker-induced beam jitter is achieved by finding the optimum blanker voltage propagation delay between the upper to lower pair of plates. From this information, the physical length of the delay line is accurately determined for any beam voltage. Different delay line lengths, hence different blankers, are provided for specific blanker voltages in order to optimize blanker performance.

Additionally, these equations determine the required mechanical tolerances for the blanker which aids in decreasing beam positional jitter. Furthermore, a method to measure the effect of electric fringe-fields on blanker action is provided which includes construction of a model of the blanker.

This model incorporates a delay line length, which minimizes beam jitter based on the assumption there is no fringe field effect.

The model is installed in a working system and the fringe field effect is determined by measuring the effective length of the blanking plates. This effective length is derived from the measured blanker plate deflection sensitivity, i.e. the beam deflection angle per applied voltage. In general, this length is greater than the physical plate length. An equivalent statement is that the beam is typically deflected off-axis a greater distance at a known axial location below the blanker than expected from using the formula describing this quantity in terms of the physical length of the blanking plates.

A new value for the optimum delay line length is then determined based on the measured "effective length" of the prototype blanker.

A blanker identical in geometry to the prototype is constructed except having a different delay line length based on the effective length. A blanker incorporating these values is then constructed.

In one embodiment, two alignment apertures are placed above and below the blanker to define the maximum off-axis beam excursion (for a movable beam stop) or to specify the concentricity of the beam stop to the blanker axis (for a fixed beam stop). The size of these apertures is typically a function of the maximum allowable beam jitter specified. A range in blanker delay line length is determined from the equations, consistent with the permissible amount of beam jitter. This tolerance range corresponds to a maximum allowable off-axis variation from the ideal beam axis, which is then mechanically defined by the blanker alignment aperture diameter.

Therefore, this invention results in greater beam positional accuracy at the target substrate while blanking.

DETAILED DESCRIPTION

Figure 1:
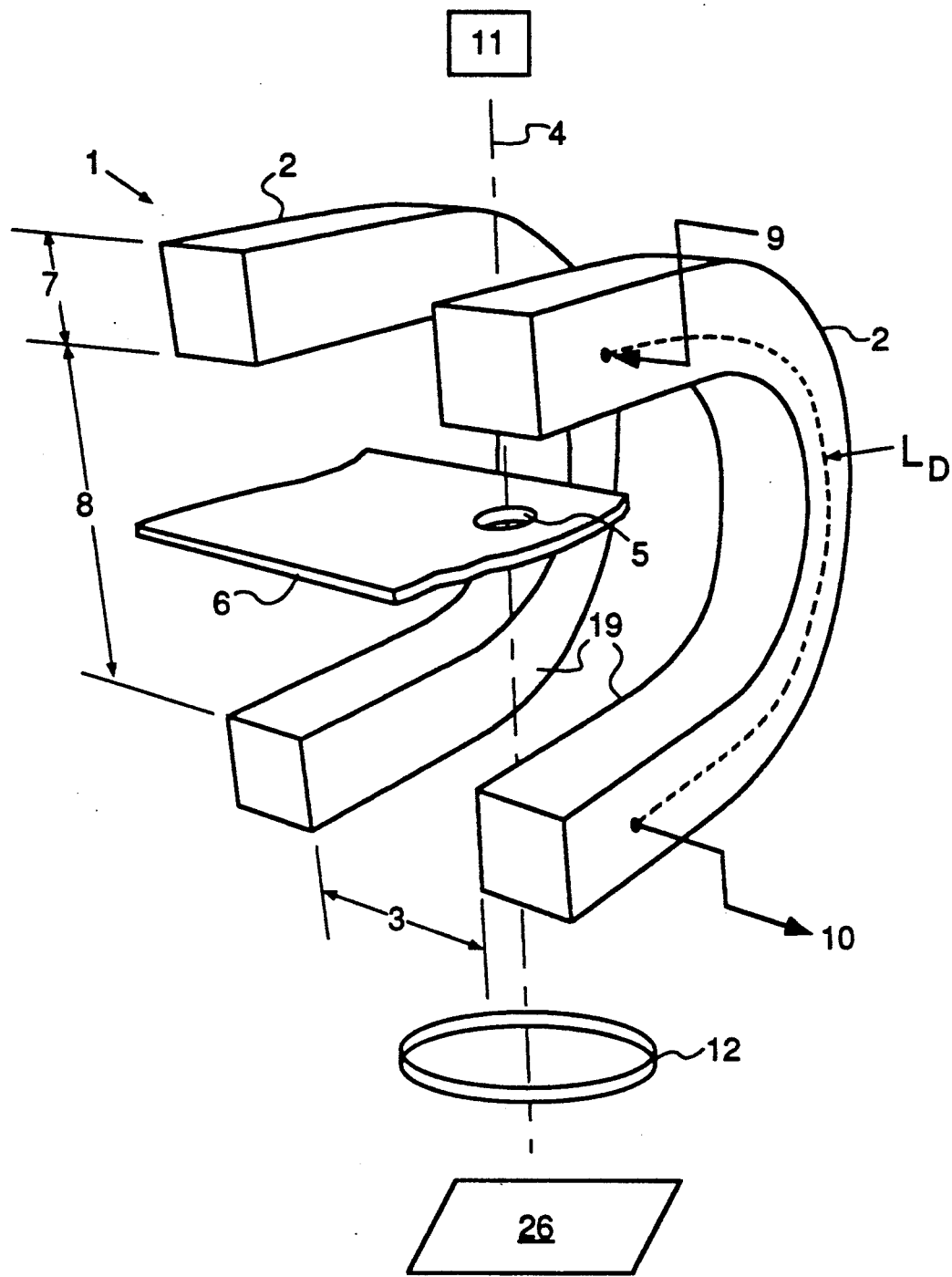
FIG. 1 illustrates a typical double-deflection beam blanker with delay line and beam stop both as used in the prior art and in accordance with the invention.

A steady state voltage, as noted previously, applied to a blanker produces a deflection of an electron beam. As seen in FIG. 1, a conventional electron focusing lens 12 which is placed between blanker 1 and target 26 focuses the beam onto the target 26. The desired object point of focusing lens 12 is the beam cross-over or rocking point. The double-deflection blanker 1 has an apparent, in optics terminology "virtual", rocking or pivot point in gap 8 between the upper and lower pairs of plates 2. If focusing lens 12 images this rocking point, the electron beam remains on-axis while applying a DC blanker voltage.

Figure 2:
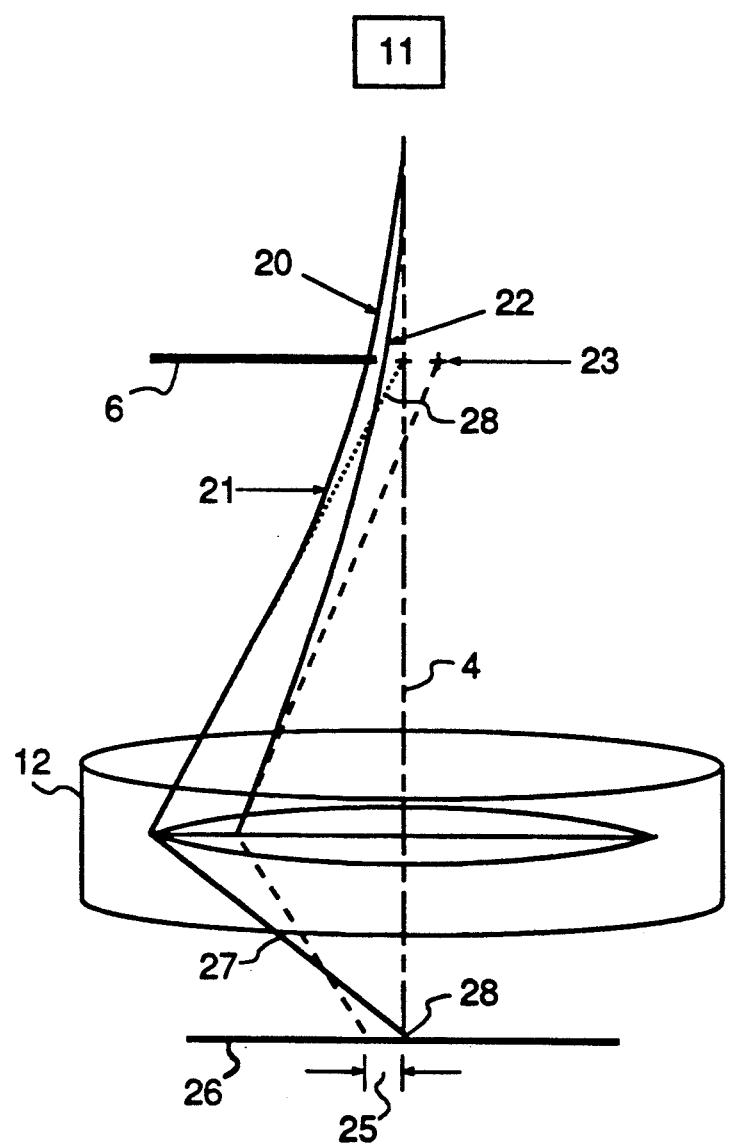
FIG. 2 shows a typical double-deflection blanker, lens, and substrate geometry in the prior art and also in accordance with the present invention.

FIG. 2 illustrates typical blanker geometry for two beam trajectories. Curve 20 shows that when the beam emitted from beam source 11 is sufficiently deviated from beam axis 4, beam stop 6 stops the beam and effectively results in an "off" state. However, if beam stop 6 were not present, curve 21 shows that lens 12 would direct the beam 27 to hit target 28 on axis 4 given (i) the blanker voltage was constant and (ii) the lens excitation focused the blanker rocking point, defined by the intersection of dashed line 28 with the vertical beam axis 4, at the substrate 26.

Curve 22 indicates a beam trajectory passing through the blanker during voltage decay which will result in beam jitter at the substrate 26. The apparent (virtual) beam off-axis deflection is shown by dashed line 23. Beam jitter $X^*$ is defined as a function of both the axial evaluation point $Z_e$ (or the lens object position) and the initial position $Z_o$ of the electron at the moment the blanker starts its off-to-on transition. Hence, $X^*(Z_e, Z_o)$ describes $X^*$ as a function of $Z_e, Z_o$. The magnitude 25 of the positional jitter at the lens image plane 26 is given by $$X^*_{Image} = Z^*(Z_e, Z_o)_{xM} \quad (1)$$

where M is the magnification of lens 12.

Figure 3:
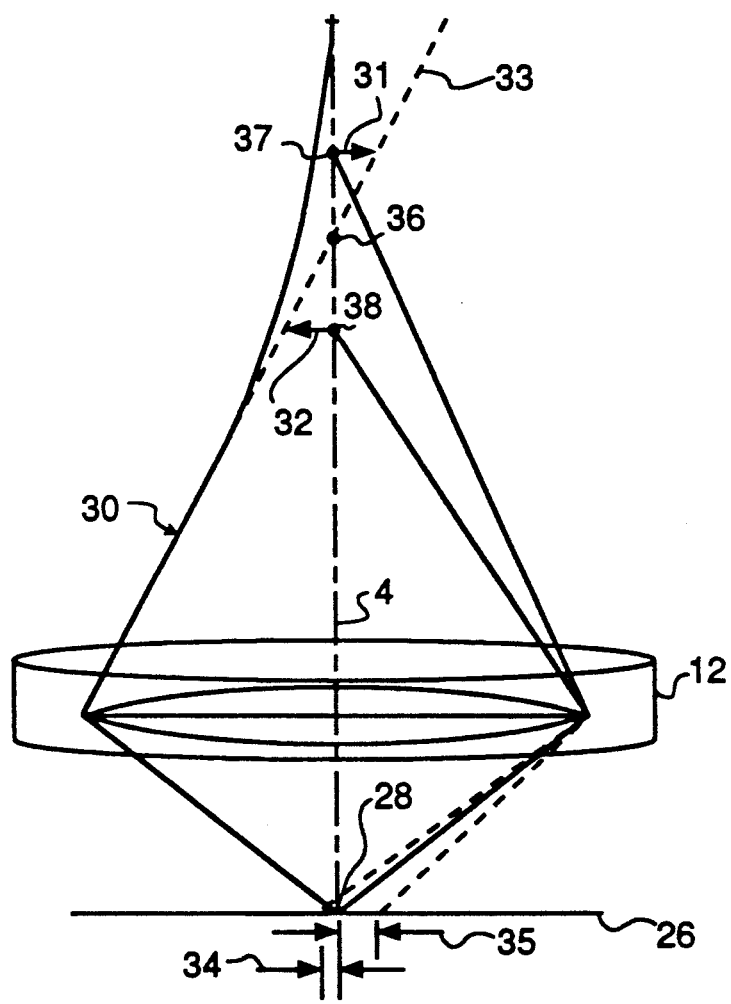
FIG. 3 illustrates a beam diagram showing the general behavior as the lens excitation is varied about the blanker midgap.

The rocking point of double-deflection blanker 1 lies at the midpoint of the gap 8 (see FIG. 1) along beam axis 4. FIG. 3 illustrates that if $$Z_e = L_p + g/2 \quad (2)$$

indicated at point 36, where L, is the plate length 7 and g is the width of gap 8 (both shown in FIG. 1), then lens 12 directs the beam 30 to hit target 28 an axis 4. Hence, with this rocking point, there is no off-axis beam shift (see dotted line 33) when a steady state voltage is applied to the blanker.

However, if $$Z_e < L_p + g/2 \quad (3)$$

indicated by point 37 then vector 31, transverse to beam axis 4 and pointing to the ray 33 of the virtual trajectory, will increase the beam jitter magnitude and result in a beam shift during application of a DC blanker voltage. Vector 31 corresponds to the magnitude 34 of the positional jitter at the lens image plane 26. If $Z_e > L_p + g/2$, indicated by point 38 then vector 32 likewise corresponds to the beam shift 35 at the lens image plane 26.

However, even when $Z_e = L_p + g/2$, some beam jitter (time-dependent motion) is inevitable. The present invention minimizes this motion by proper setting of the delay line length $L_D$.

Beam jitter provides a measure of blanker performance in terms of movement (of the beam) per applied force (by the blanker) with dimensions of [time × distance]. The distance unit is defined as the maximum positional offset during beam transmission. The time unit is defined as that interval during which the beam is still outside its specified positional accuracy range.

To reduce beam jitter for any double-deflection beam blanker, the operation and interaction of the blanker geometry, the blanker voltage, and the beam itself should be fully understood. One embodiment of the present invention, using the derived equations shown in Tables I and II below, provides a method for ensuring a high accuracy beam blanker.

The double-deflection beam blanker 1 (see FIG. 1) and its operating characteristics are completely defined by two sets of blanker variables. The first set of variables includes the geometrical parameters of the blanker: the plate length $L_p$ (7), the plate separation D (3), the gap g (8) between upper and lower pairs of plates, the delay line length $L_D$, and the blanker aperture diameter $d_{ap}$ of aperture 5.

In general, the plate length $L_p$ is made as large as possible to improve deflection sensitivity, i.e. deflection per applied voltage. An increase in plate length $L_p$ provides more opportunity for the electron beam to be acted upon, thereby increasing its deflection. This allow the blanker voltage to be reduced thereby increasing the speed of the blanker driver. However, in high speed blanking circuits, this dimension is limited to a ratio $L_p/D$ as determined by the magnitude of the impedance desired to make double-deflection beam blanker 1 a transmission line electrically matched to the blanker driver electronics. An impedance mismatch results in reflections at the input 9 and output 10 of the delay line as the voltage signal propagates through plates 2. These reflections inject spurious voltages, thereby degrading a desired step voltage when going from "on" to "off" and vice versa. The design equations describing the relationship between the ratio $L_p/D$ and the impedance are well-known for strip-line and parallel plate geometries of blankers and, hence, are not provided herein. See, for example, *MECL System Design Handbook*, 4th ed., by William R. Blood, Jr., Motorola Inc., 1988. The upper limit on the blanker plate length is typically set by space constraints of the other system components of which the blanker is one part.

The second set of variables contains two parameters (a,b) that describe a time-dependent, normalized, exponentially-damped cosine blanker voltage (i.e., the voltage signal that is impressed on the blanker), given by the equation below:

$$V(t)/V_d = \exp(-at) \cdot \cos(bt) \tag{4}$$

This equation models ringing, or oscillation in the voltage, overshoot, when the voltage is above the intended voltage, and the rise and fall time where $V_d$ is the maximum applied blanker voltage. This description of the blanker voltage is a general solution for any blanker driver circuit described as a resistive, inductive, capacitive (RLC) network. The formulae in Tables I and II incorporate this form of the blanker voltage. Hence, a and b are to be chosen to match the particular driver electronics of a blanker (which can be determined, for example, with an oscilloscope) so as to model any blanker voltage used in any blanker.

Tables I and II express the solution for the normalized, apparent beam motion $X^*(Z_e)/(V_d/2V_bD)$ as the complex variable equation:

$$S = -A + iB \tag{5}$$

where A, expressed in units of 1/length, is defined by the further equation $$A = a(m/2eV_b)^{\frac{1}{2}} \tag{6}$$

where m is the electron mass, e is the electron charge, and $V_b$ is the beam voltage.

Likewise, B is defined by the equation $$B = b(m/2eV_b)^{\frac{1}{2}} \tag{7}$$

The real parts of equations given in Tables I and II describe the apparent beam motion at the lens object plane.

The beam motion is apparent because $X^*(Z_o)$ is the off-axis beam position within the blanker, as magnified by the lens, but does not correspond to the actual trajectory within the blanker $X(Z, Z_o)$. The curve $X^*(Z_o)$ describes the time-evolution of the apparent beam motion for any lens object position $Z_e$ since $T_o = V_z Z_o$, where $V_z$ is the relativistically-corrected beam velocity and $T_o$ denotes the time it takes the electron to reach the entrance of the blanker after the voltage transition began.

The propagation delay of the blanker voltage through plates 2 can be physically defined in three ways. The first way is shown in FIG. 1, where a U-shaped blanker plate structure conducts the blanking signal $V_d(t)$ from its input 9 at the upper pair of plates 2 to the exit point 10 at the lower set of plates 2 via the length $L_D$. The blanker voltage transit between the upper and lower pairs of plates is given by the delay time $$T_D = L_D/d \tag{8}$$

where c is the speed of light and also the propagation velocity of the blanker voltage transition assuming a dielectric constant of one is present. Second, the horseshoe-shaped blanker can also be replaced by a wire or cable connecting two separate pairs of plates (not shown). In that case, the propagation velocity $V_{cable}$ is determined by the cable dielectric and the delay line length. Hence, $$T_D = L_D/V_{cable} \tag{9}$$

The third case uses an amplifier stage to set the time delay between a blanking signal applied to the upper and lower pairs of plates (also not shown). This latter configuration is particularly useful in the case of blanking ions, which move slower than electrons at a given beam voltage and, therefore, require longer time delays in the blanker.

Nine solutions for beam jitter are possible, as seen in Tables I and II, depending on the variables $z_0$, $z_1$, $z_2$, $z_3$, and $z_d$ (where $z_d$ is the electron drift length defined by $T_D/V_z$, where $V_z$ is the relatavistically corrected beam velocity). Applicable equations from Table I are indicated on FIG. 4. The following equations do not appear in this particular example: 1c, 2a, 3a, and 3b. Recall that $z_0$ is the initial electron position when the blanker voltage transition begins. Therefore, $z_0 < 0$ implies that the electron was initially above the blanker.

Figure 4:
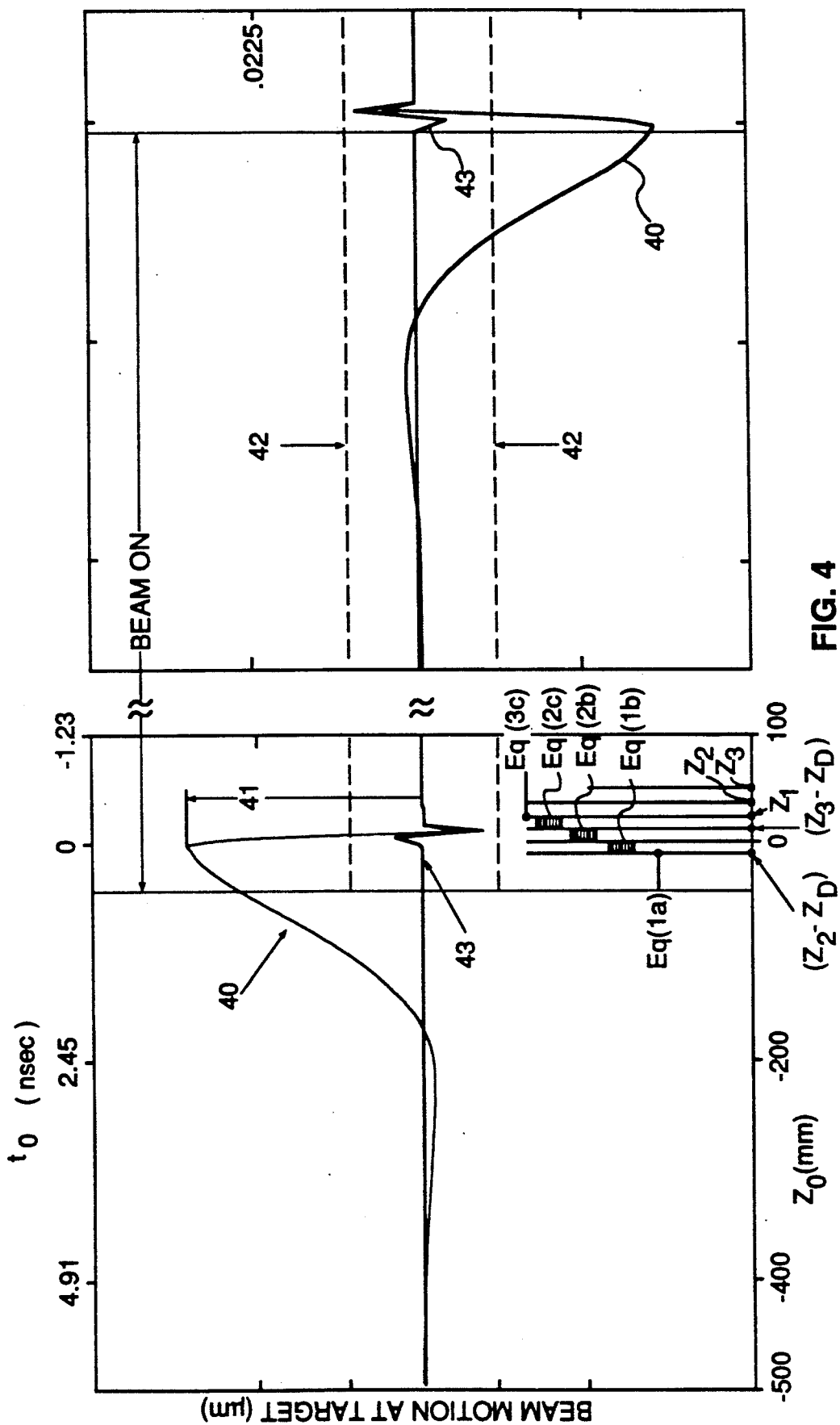
FIG. 4 compares the performance of the prior art blanker with that of the present invention operating at 20 kV beam voltage.

Two scales, $t_0$ and $z_0$, are indicated on the horizontal axis of FIG. 4. The conversion from $t_0$ to $z_0$ is accomplished by recognizing that:

$$z_0(mm) = -t_0(nsec) \times 81.50 \text{ mm/nsec} \tag{10}$$

where 81.50 mm/nsec is the relativistically-corrected velocity for a 20 kV beam voltage. The minus sign defines a convention where $z_0 < 0$ implies $t_0 > 0$, so that $t_0$ indicates the time taken for an electron at $z_0 < 0$, i.e. above the blanker, to reach the blanker entrance (z=0) is a positive number.

Referring to FIG. 4, for example, the horizontal axis is divided into nine segments. Each solution in Table I, as derived from, for example, equations 3c, 2c, 1b, etc., describes the amount of beam jitter in a particular segment. The size of each segment is determined by the blanker geometry (for example, $z_1$, $z_2$ and $z_3$) and the delay line length $L_d$.

The real part of the complex variable equation is combined with the geometrical data on the blankers (already provided) to solve for the apparent beam jitter. Note that Table I applies to the transition from beam "off" to "on", while Table II applies to the transition from "on" to "off". Tables I and II allow optimization of blanker performance by specifying an accurate delay line length $L_D$ which minimizes beam jitter in the device. Specifically, given a beam voltage, blanker geometry, blanker voltage, and axial observation point, one varies electron drift length $Z_d$ until a minimum off-axis deflection determined by the equation:

$$T_D = Z_d \div V_z. \tag{11}$$

Using $T_D$, $L_D$ is determined by recognizing that $L_D$ is in equal to $T_D$ multiplied by the blanker voltage propagation velocity c when the blanker voltage dielectric constant is one.

If, after providing the values to the variables specified in Tables I and II, an unacceptable level of jitter is present, a new value of $Z_d$ is chosen. In this manner, beam jitter is not only predictable but can be efficiently minimized for any blanker.

As previously noted, a blanker voltage applied to the plates produces an electric field transverse to the electron beam axis. However, this field does not end at the finite end of the plate, but instead extends off the plate into space. This extension is called the fringe-field. Hence, the fringe-field effectively increases the length of the deflection field beyond that defined by the physical plate length. Without a measurement of this field and subsequent incorporation in the blanker design, the blanker positional accuracy is degraded.

Figure 9:
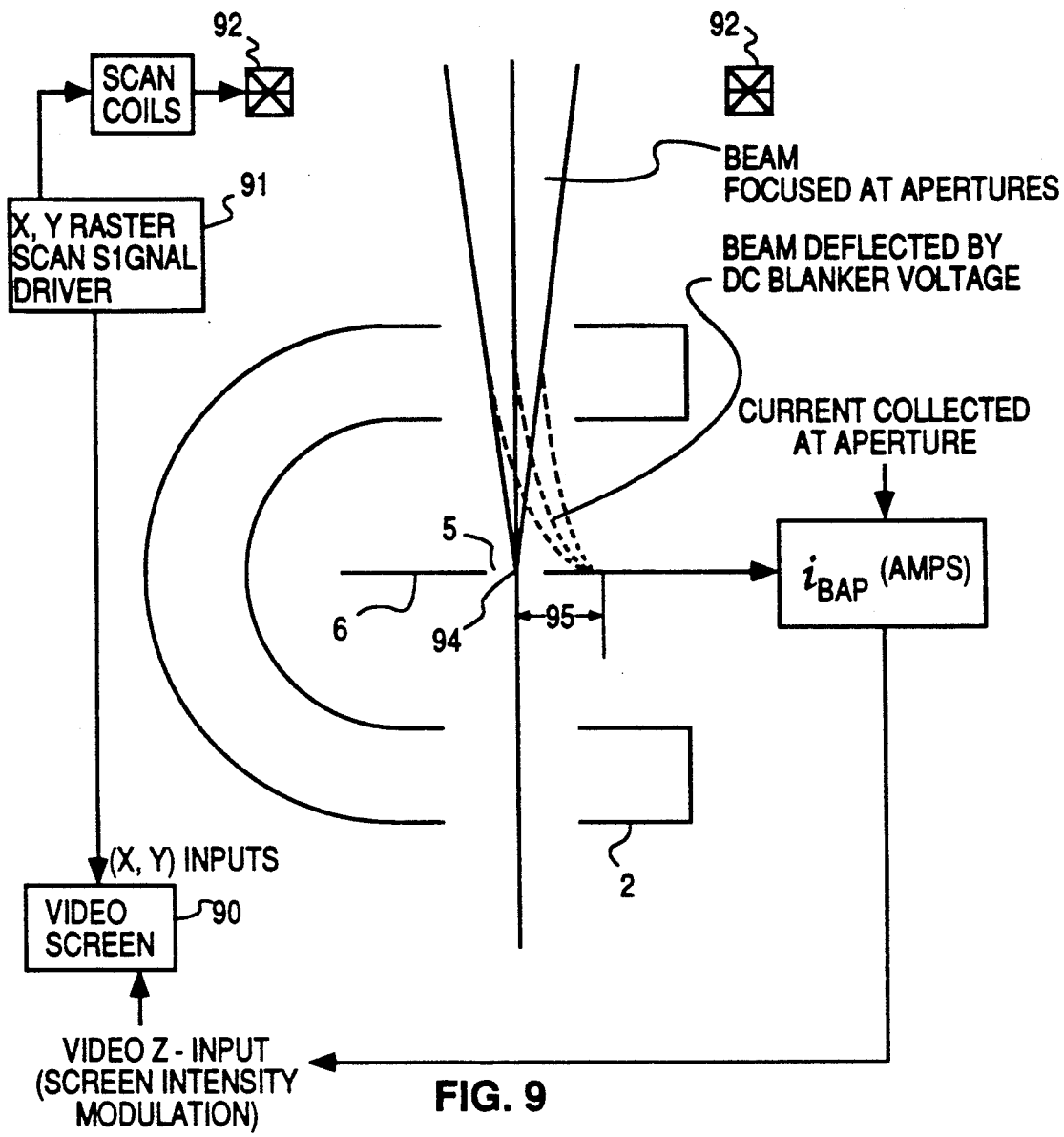
FIG. 9 illustrates part of the process and geometries used in the present invention to determine the effective blanker plate length.
Figure 10:
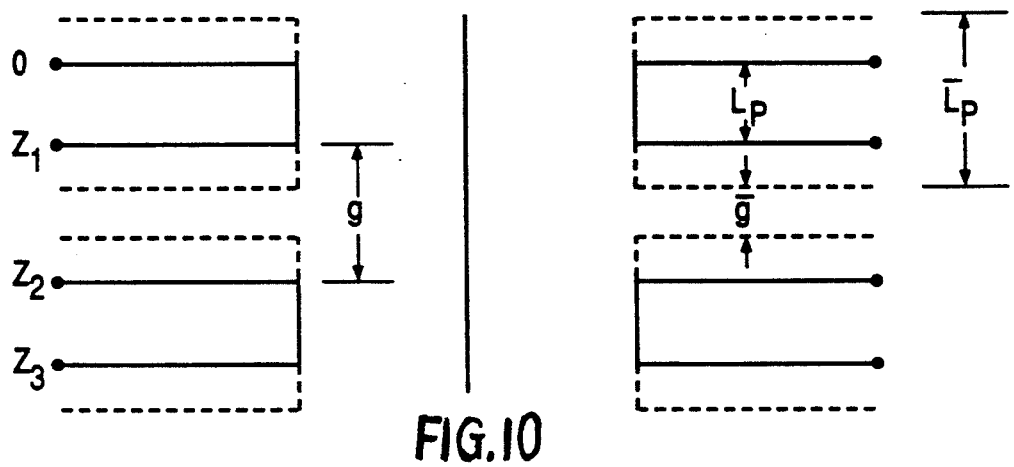
FIG. 10 shows a typical comparison of the plate length Lp and gap g to the effective plate length $\overline{L}p$ and effective gap $\overline{g}$ after fringe field effects have been determined.

The present invention in one embodiment compensates for fringe-field effects by a three-step process. First, as seen above, the equations of motion are used to predict the optimum delay line length. Second, an experimental measurement facilitated by construction of a first blanker model determines the effective blanker plate length. The measurement consists of the following procedure (See FIGS. 9 and 10).

The beam is focused at center 94 of blanker aperture 5. Provision is made to collect the current at center 94 preamplify it, and send it to Z-input of a video system 90 where it results in intensity modulation of the video image. The x-y raster scan signal is simultaneously sent from the driver 91 to (a) the video system 90 and (b) a set of beam scan coils 92. In this manner an image of blanker aperture 5 is formed at the video 90. A first blanker aperture 5 image is recorded with a camera (not shown), which corresponds to both blanking plates 2 being at ground potential, so the beam is undeflected.

A second image is recorded after having impressed a known DC blanker voltage on plates 2. The second image reveals a translational shift $\Delta X_{image}$ in the position of center 94 as seen by distance 95 compared to the first image (undeflected beam case). The video image beam shift $\Delta X_{image}$ is converted to the true beam shift $\overline{\Delta X}$ by comparing known blanker aperture diameter $d_{AP}$ to its video image size $d_{BIM}$, for then $$\overline{\Delta X} = \Delta X_{image} \times (d_{AP}/d_{BIM}) \quad (12)$$

The relation between the D.C. blanker voltage $V_{cd}$ and the resulting steady state beam shift $\overline{\Delta X}$ is $$\overline{\Delta X}(Z_\theta) = V_{dc}(Z_\theta - \overline{L_p}/2)2V_B D \quad (13)$$

where $V_B$ is the beam voltage, D is the dimension 3 of FIG. 1, $\overline{L_p}$ is the "effective" plate length, $\overline{g}$ is the "effective" gap, and $Z_e$ is the axial evaluation point, which in this case is the center 94 location $Z_\theta = \overline{L_p} + \overline{g}/2$. Generally, for any blanker, $\overline{L_p} > L_p$, where $L_p$ is the physical plate length defined by dimension 7 of FIG. 1, due to the fringe field increasing the effective length of the blanker plate. The shift $\overline{\Delta X}$ actually observed is greater than that for expected value $\Delta X$ if Eq. (12) replaces $\overline{L_p}$ by $L_p$ by the amount $$\epsilon = \frac{\overline{\Delta X}}{\Delta X} = \frac{\overline{L_p}(\overline{L_p} + \overline{g})}{L_p(L_p + g)} \quad (14)$$

Now, $\epsilon$ is determined from the measured shift $\overline{\Delta X}$, the known blanker geometry $L_p$, g. Thus, the only unknown variable remaining is $\overline{L_p}$, which is then solved in terms of the known quantities and is expressed by the equation $$\overline{L_p} = -(g + \tfrac{1}{2}L_p) + \sqrt{(g + \tfrac{1}{2}L_p)^2 + 2\epsilon L_p(L_p + g)} \quad (15)$$

$\overline{g}$ is dependent on $\overline{L_p}$ and follows as $$\overline{g} = (g + \tfrac{1}{2}L_p) - \tfrac{1}{2}\overline{L_p} \quad (16)$$

The effective length $\overline{L_p}$ and gap $\overline{g}$ are thus determined. Third, the delay time is recalculated based on the measured effective plate length. As a result, a final model of the blanker is constructed for a particular, given voltage.

By using the preceding derived equations and compensating for fringe field effects, significant performance improvements are demonstrated in accordance with the present invention compared to the prior art. As mentioned previously, the prior art blanker was designed specifically for 20 kV beam voltage operation. FIG. 4 illustrates that a blanker in accordance with the present invention improves blanker performance when used at a 20 kV beam voltage because of the increased accuracy of the exact equations of motion and the incorporation of fringe fields. The beam motion in both cases assumes a $V_d = 7.5$ V blanker voltage, a 1.0 nsec 10–90% transition, and $M_{LENS} = 0.3$. A 25 $\mu$m diameter blanker aperture is used.

Curve 40 of FIG. 4 shows the beam jitter induced by the prior art design at 20 kV which does not compensate for the blanker plate fringe fields. The maximum positional offset 41 is 0.03 $\mu$m. The beam is misplaced outside a 0.01 $\mu$m limit (i.e. the limit defines when the electron beam is within 0.01 $\mu$m from target) shown by dashed lines 42 for 1.4 nsec. This corresponds to 22% of the dose in the first pixel being misplaced in a raster-scan electron beam system, which blanks at 160 MHz. Curve 43 shows the blanker with an increased delay line length as determined by the method of the present disclosure which compensates for the fringe field effect. In this case, the beam positional accuracy is maintained at all times during the blanker exposure.

Figure 5:
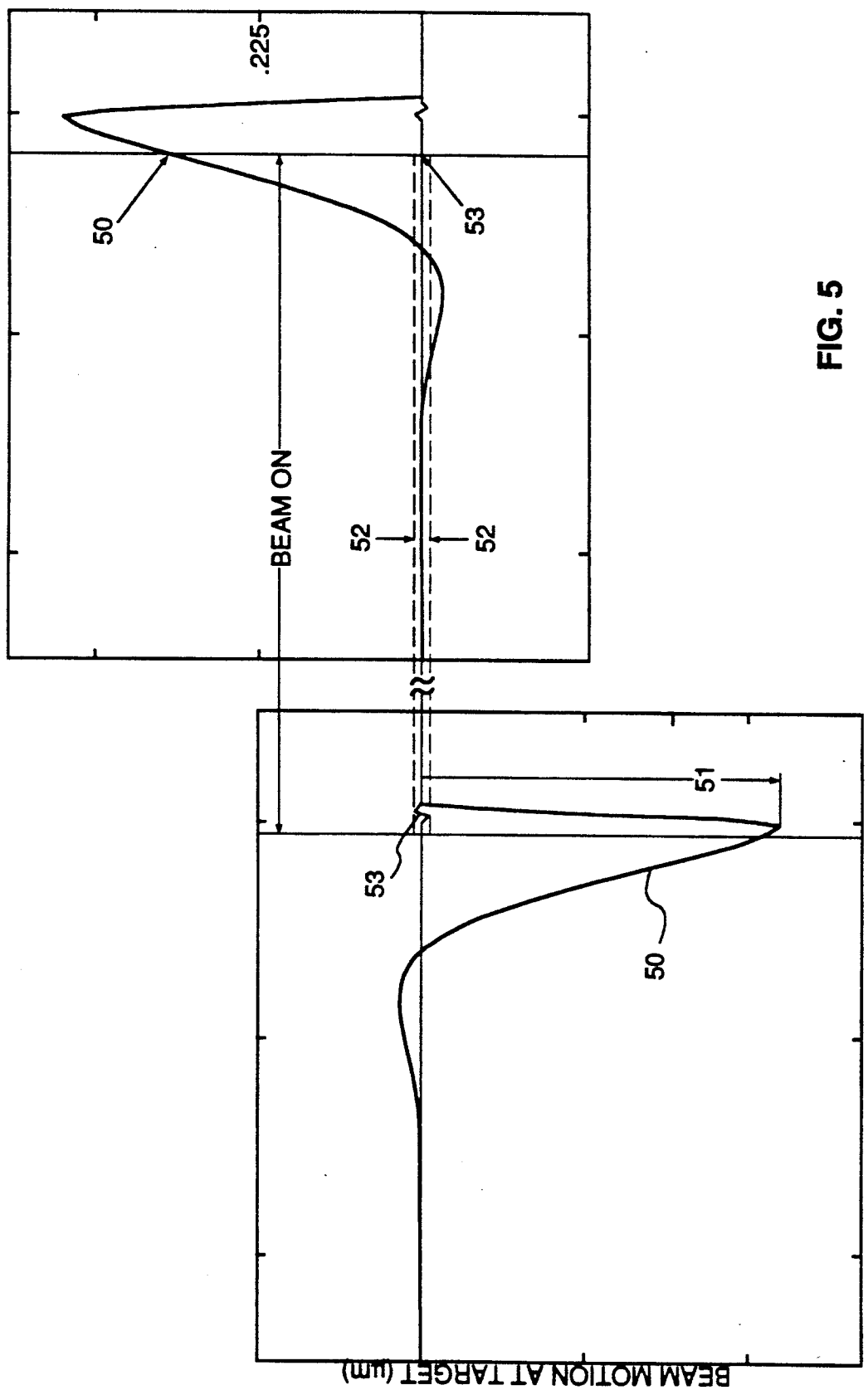
FIG. 5 compares the beam jitter of the prior art blanker with that of the present invention operating at 10 kV beam voltage.

FIG. 5 shows that the 20 kV prior art design is unsuitable for 10 kV operation. The operating parameters noted in FIG. 4 are used. In this case, the prior art blanker has a 0.50 $\mu$m maximum positional offset 51 as shown by curve 50. The time duration outside the 0.01 $\mu$m beam accuracy specification (see dashed line 52) is 3.3 nsec. Hence, using this prior art design at a 160 MHz blanking rate results in 53% of the first pixel dosage being misplaced. The blanker in accordance with the present invention remains within the positional accuracy range for all times as shown by curve 53. One specific double-deflection blanker design optimized for $V_b = 10$ kV operation in accordance with the present invention is shown in FIG. 5 where $L_p = 10.16$ mm, $g = 29.82$ mm, $D = 2.16$ mm, and $Z_D = 41.615$ mm.

Figure 6:
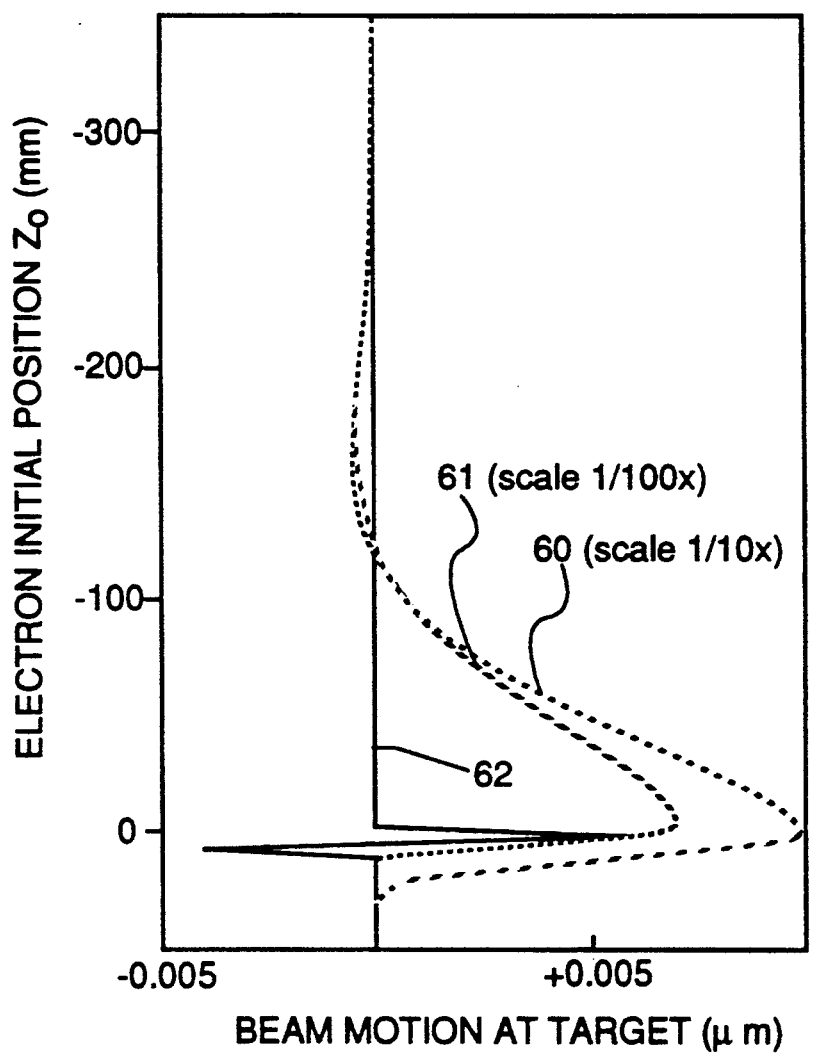
FIG. 6 illustrates blanker-induced beam motion $X^*(Z_o)$ sensitivity to various drift length $Z_D$ settings.

In an attempt to expand the range of the '041 patent disclosure beyond 20 kV operation, a geometrical scaling rule cast in terms of electron drift length $Z_D$ was proposed in the prior art. The scaling rule sets the blanker delay time according to a drift length based on the blanker plate length $L_p$ and gap g between upper and lower pairs of plates such that $Z_D = L_p + g/2$. Another publication (co-authored by the inventor of the present disclosure), Gesley and Condran, J. Vac. Sci. Technol. vol. B8(6), 1666 Nov/Dec (1990), provides the approximation of $Z_D + L_p + g$. However, as shown in FIG. 6, neither of these approximations are adequate to achieve the optimum performance at any beam voltage. In the $(L_p + g/2)$ case (see dotted curve 60), the maximum offset is 150 times greater than the optimum setting (see solid line 62). For the $(L_p + g)$ case (see the dashed curve 61), it is 10 times worse than the optimum.

Figure 7:
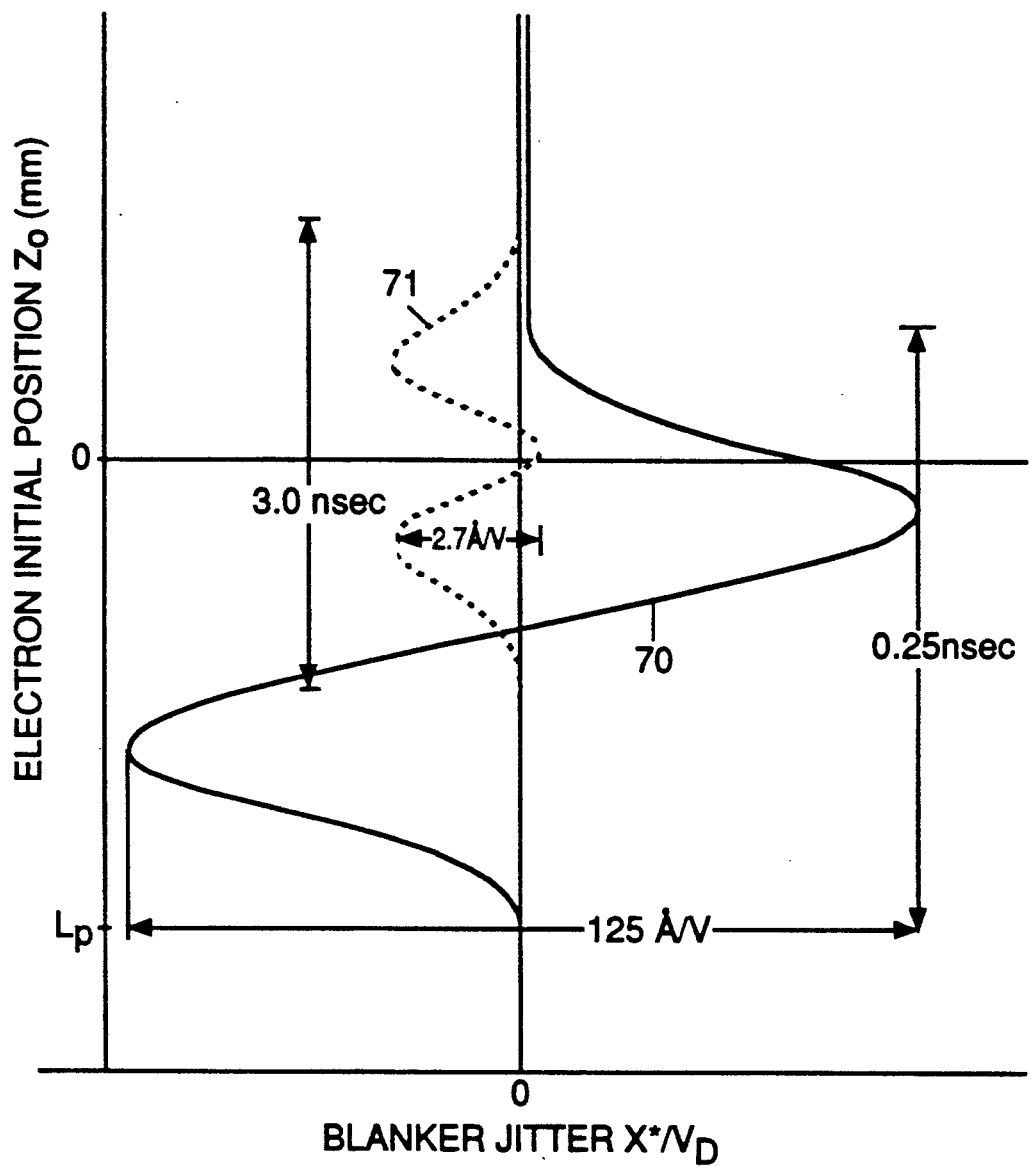
FIG. 7 compares blanker motion $X^*(Z_o)$ curves using blanker conditions noted in the prior art.

FIG. 7 shows another example of the inadequacy of the blanker operation as discussed in the Gesley and Condran publication. The operating parameters for the blankers are $V_b = 20$ kV with a 1 nanosecond voltage decay. The solid curve 70 is that found using the solutions given in the present disclosure. The dashed curve 71 is taken from the '041 patent and is matched only at the origin, its scale is given by the dashed lines. The numerical analysis as disclosed in the Gesley and Condran publication cannot determine the magnitude or duration of the "blip" region, which is the rapidly changing portion of the apparent beam jitter.

Figure 8:
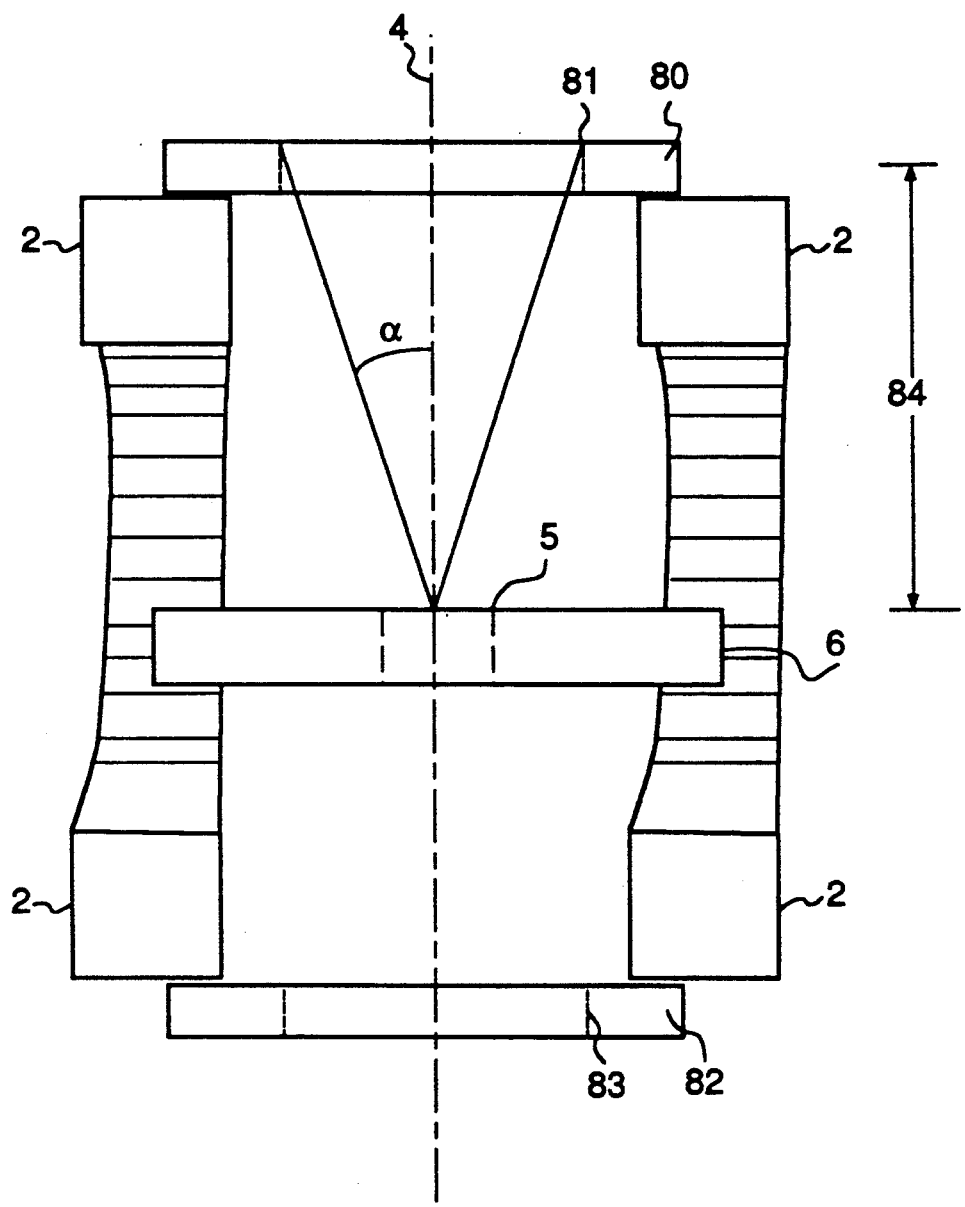
FIG. 8 shows an end view of a double-deflection blanker with alignment apertures.

To ensure that the delay line length tolerance is not violated, a mechanical means is introduced to ensure the off-axis beam position with respect to the blanker axis is within a specified limit (assuming the use of a moveable aperture as beam stop). This is accomplished by placing alignment plates 80, 82 having apertures 81, 83, seen in FIG. 8, above and below respectively the blanker body I to define the blanker mechanical axis 4. When beam stop 6 having aperture 5 is moveable, the apertures 81, 83 define the maximum off-axis beam excursion. Limiting the beam offset ensures that maximum variation of the delay line length is kept to a specified minimum. For a beam stop 6 having aperture 5 which is fixed, apertures 81, 83 specify the concentricity of beam stop 6 to the blanker axis 4.

In the embodiment of the present invention, for 10 KV operation (see also reference to FIG. 5 for other parameters of blanker), distance 84 in 25 mm, alignment apertures 81 and 83 each have a diameter of 600 mm, and aperture 5 has a diameter of 50 mm. The diameter of alignment apertures 81, 83 is the maximum allowed in order to maintain positional accuracy of the beam within 0.01 $\mu$m of the target. The delay length $L_D$ has a tolerance which defines the outside limits of this positional accuracy. For this example, by using Tables I and II, $L_D$ is determined to be 209.5 mm with a tolerance of 0.3 mm.

The present invention is aided by the use of a computer program which facilitates the calculation of the delay line length. The computer program, shown in Appendix I, is written is C-language and is run on any conventional PC. Although the computer program greatly reduces the time necessary to perform the calculations all formulae in accordance with the present invention are provided in Tables I and II. Hence, the present invention is readily implemented without the use of the computer program.

The method and apparatus provided by the present invention has several advantages:

1. Beam motion at the target is significantly reduced.
2. Blanker delay time is precisely determined which ensures an accurate blanker.
3. The double-deflection blanker voltage propagation delay time is accurately specified for any beam voltage.
4. Beam voltages other than 20 kV can be used in blankers without significant degradation of device performance.
5. Blanker accuracy is improved at all beam voltages by incorporating the fringe field effect into the blanker design.
6. A specific design for 10 kV beam voltage operation compatible with a 50 $\Omega$ transmission line is given.
7. A further reduction in beam jitter is achieved for the 20 kV beam blanker by use of exact solutions describing the blanker-beam interaction and incorporation of the experimentally measured blanker fringe field effect.
8. Delay line length tolerance is not violated by placing two alignment apertures above and below the blanker.

Other variations of this device will be obvious to those skilled in the art in view of the appended claims.

TABLE I

Summary of $\frac{X^*(Z)}{V_d/2V_bD}$ with $Z_1 \leq Z \leq Z_2$

Beam off → on

| | a) $(Z_0 + Z_d) \leq Z_2$ | b) $Z_2 \leq (Z_0 + Z_d) \leq Z_3$ | c) $Z_3 \leq (Z_0 + Z_d)$ |
|---|---|---|---|
| 1. $Z_0 \leq 0$ | $S^{-1}e^{S(Z_3-Z_0-Z_d)}(S^{-1} + Z - Z_3) -$ <br> $S^{-1}e^{S(Z_2-Z_0-Z_d)}(S^{-1} + Z - Z_2) +$ <br> $S^{-1}e^{S(Z_1-Z_0)}(S^{-1} + Z - Z_1) -$ <br> $S^{-1}e^{-SZ_0}(S^{-1} + z)$ | $S^{-1}e^{S(Z_3-Z_0-Z_d)}(S^{-1} + Z - Z_3) +$ <br> $S^{-1}e^{S(Z_1-Z_0)}(S^{-1} + Z - Z_1) -$ <br> $S^{-1}e^{-SZ_0}(S^{-1} + Z) -$ <br> $S^{-1}(S^{-1} + Z - Z_0 - Z_d) +$ <br> $Z(Z_0 + Z_d - Z_2) - \frac{1}{2}(Z_0 + Z_d)^2 +$ <br> $\frac{1}{2}Z_2^2$ | $S^{-1}e^{S(Z_1-Z_0)}(S^{-1} + Z - Z_1) -$ <br> $S^{-1}e^{-SZ_0}(S^{-1} + Z) +$ <br> $Z_1(Z - Z_3 + \frac{1}{2}Z_1)$ |
| 2. $0 \leq Z_0 \leq Z_1$ | $S^{-1}e^{S(Z_3-Z_0-Z_d)}(S^{-1} + Z - Z_3) -$ <br> $S^{-1}e^{S(Z_2-Z_0-Z_d)}(S^{-1} + Z - Z_2) +$ <br> $S^{-1}e^{S(Z_1-Z_0)}(S^{-1} + Z - Z_1) -$ <br> $\frac{1}{2}Z_0^2 + (Z_0 - S^{-1})(S^{-1} + Z)$ | $S^{-1}e^{S(Z_3-Z_0-Z_d)}(S^{-1} + Z - Z_3) +$ <br> $S^{-1}e^{S(Z_1-Z_0)}(S^{-1} + Z - Z_1) +$ <br> $(Z_0 - S^{-1})(Z + S^{-1}) - \frac{1}{2}Z_0^2 +$ <br> $(Z_0 + Z_d - Z_2 - S^{-1})(Z - Z_0 - Z_d) -$ <br> $S^{-2} + \frac{1}{2}(Z_0 + Z_d)^2 + \frac{1}{2}Z_2^2 -$ <br> $Z_2(Z_0 + Z_d)$ | $S^{-1}e^{S(Z_1-Z_0)}(S^{-1} + Z - Z_1) +$ <br> $(Z_0 - S^{-1})(Z + S^{-1}) +$ <br> $\frac{1}{2}Z_1^2 - \frac{1}{2}Z_0^2 +$ <br> $Z_1(Z - Z_3)$ |
| 3. $Z_1 \leq Z_0$ | $S^{-1}e^{S(Z_3-Z_0-Z_d)}(S^{-1} + Z - Z_3) -$ <br> $S^{-1}e^{S(Z_3-Z_0-Z_d)}(S^{-1} + Z - Z_3) +$ <br> $Z_1(Z - \frac{1}{2}Z_1) =$ <br> $S^{-1}e^{S(Z_3-Z_0-Z_d)}(Z - Z_3 + S^{-1}) -$ <br> $S^{-1}e^{S(Z_3-Z_0-Z_d)}(Z - Z_2 + S^{-1}) -$ <br> $\frac{1}{2}Z_1^2 +$ <br> $ZZ_1$ | $S^{-1}e^{S(Z_3-Z_0-Z_d)}(S^{-1} + Z - Z_3) +$ <br> $(Z_0 + Z_d - g - S^{-1})(Z - Z_0 - Z_d) +$ <br> $Z_1(\frac{1}{2}Z_1 + g) + \frac{1}{2}[(Z_0 + Z_d)^2 - Z_2^2] -$ <br> $S^{-2} - g(Z_0 + Z_d - Z_2) =$ <br> $S^{-1}e^{S(Z_3-Z_0-Z_d)}(Z - Z_3 + S^{-1}) +$ <br> $\frac{1}{2}Z_2^2 - \frac{1}{2}(Z_0 + Z_d)^2 - \frac{1}{2}Z_1^2 +$ <br> $(Z_0 + Z_d)S^{-1} - S^{-2} +$ <br> $Z(Z_1 + Z_0 + Z_d - Z_2 - S^{-1})$ | $2Z_1Z - (2Z_1 + g)Z_1 =$ <br> $2Z_1Z - Z_3Z_1$ | where $Z_1 = Z_1 = L_p, Z_2 = L_p + g, Z_3 = 2L_p + g,$ and $S = -A + iB,$
where $A = a(m/2eV_b)^{\frac{1}{2}}$ and $B = b(m/2eV_b)^{\frac{1}{2}}$

TABLE II

Summary of $X^*(Z)/(V_d/2V_bD)$ with $Z_1 \leq Z \leq Z_2$
Beam on → off.

| | a) $(Z_0 + Z_d) \leq Z_2$ | b) $Z_2 \leq (Z_0 + Z_d) \leq Z_3$ | c) $Z_3 \leq (Z_0 + Z_d)$ |
|---|---|---|---|
| 1. $Z_0 \leq 0$ | $2ZZ_1 -$ <br> $\frac{1}{2}Z_3^2 + \frac{1}{2}Z_2^2 - \frac{1}{2}Z_1^2 -$ <br> $S^{-1}e^{S(Z_3-Z_0-Z_d)}(Z - Z_3 + S^{-1}) +$ <br> $S^{-1}e^{S(Z_2-Z_0-Z_d)}(Z - Z_2 + S^{-1}) -$ | $Z(Z_3 - Z_0 31 Z_d + Z_1 + S^{-1}) -$ <br> $\frac{1}{2}Z_3^2 + \frac{1}{2}(Z_0 + Z_d)^2 - \frac{1}{2}Z_1^2 +$ <br> $S^{-2} - S^{-1}(Z_0 + Z_d) -$ <br> $S^{-1}e^{S(Z_3-Z_0-Z_d)}(Z - Z_3 + S^{-1}) -$ | $ZZ_1 - \frac{1}{2}Z_1^2 +$ <br> $S^{-1}e^{S(Z_1-Z_0)}(Z - Z_1 + S^{-1}) +$ <br> $S^{-1}e^{-SZ_0}(Z + S^{-1})$ |

TABLE II-continued

| | Summary of $X^*(Z)/(V_d/2V_bD)$ with $Z_1 \leq Z \leq Z_2$ | | |
| | Beam on → off. | | |
| | a) $(Z_0 + Z_d) \leq Z_2$ | b) $Z_2 \leq (Z_0 + Z_d) \leq Z_3$ | c) $Z_3 \leq (Z_0 + Z_d)$ |
|---|---|---|---|
| 2. $0 \leq Z_0 \leq Z_1$ | $S^{-1}e^{S(Z_1-Z_0)}(Z - Z_1 + S^{-1}) +$ $S^{-1}e^{-SZ_0}(Z + S^{-1}) -$ $Z(2Z_1 - Z_0 + S^{-1}) -$ $\frac{1}{2}Z_3^2 + \frac{1}{2}Z_2^2 - \frac{1}{2}Z_1^2 + \frac{1}{2}Z_0^2 +$ $S^{-1}(Z^{-1} - Z_0) -$ $S^{-1}e^{S(Z_3-Z_0-Z_d)}(Z - Z_3 + S^{-1}) +$ $S^{-1}e^{S(Z_2-Z_0-Z_d)}(Z - Z_2 + S^{-1}) -$ $S^{-1}e^{S(Z_1-Z_0)}(Z - Z_1 + S^{-1})$ | $S^{-1}e^{S(Z_1-Z_0)}(Z - Z_1 + S^{-1}) +$ $S^{-1}e^{-SZ_0}(Z + S^{-1}) -$ $Z(Z_3 - 2Z_0 - Z_d + Z_1 + 2S^{-1}) -$ $\frac{1}{2}Z_3^2 + \frac{1}{2}(Z_0 + Z_d)^2 -$ $\frac{1}{2}Z_1^2 + \frac{1}{2}Z_0^2 +$ $2S^{-2} - S^{-1}(2Z_0 + Z_d) -$ $S^{-1}e^{S(Z_1-Z_0)}(Z - Z_1 + S^{-1}) -$ $S^{-1}e^{S(Z_3-Z_0-Z_d)}(Z - Z_3 + S^{-1})$ | $Z(Z_1 - Z_0 + S^{-1}) +$ $\frac{1}{2}Z_0^2 - \frac{1}{2}Z_1^2 +$ $S^{-1}(Z^{-1} - Z_0) -$ $S^{-1}e^{S(Z_1-Z_0)}(Z - Z_1 + S^{-1})$ |
| 3. $Z_1 \leq Z_0$ | $ZZ_1(+) -$ $\frac{1}{2}Z_1^2 - Z_1Z_2 -$ $S^{-1}e^{S(Z_3-Z_0-Z_d)}(Z - Z_3 + S^{-1}) +$ $S^{-1}e^{S(Z_2-Z_0-Z_d)}(Z - Z_2 + S^{-1})$ | $Z(Z_3 - Z_0 - Z_d + S^{-1}) -$ $\frac{1}{2}Z_3^2 + \frac{1}{2}(Z_0 + Z_d)^2 -$ $S^{-1}(Z_0 + Z_d) + S^{-2} -$ $S^{-1}e^{S(Z_3-Z_0-Z_d)}(Z - Z_3 + S^{-1})$ | 0. |

APPENDIX I

```
#include <stdio.h>
#include <math.h>
#include <values.h>
#include "comtyp.h"
#include "m4blksim.h"

/* MEBES IV BLanKer SIMulation program */

/* The M4BLKSIM program accepts and opens an optional parameter
 * input file. If no such file is specified, the program prompts
 * the user for simulation parameters and reads them from stdin.
 * If a file is specified as the source of simulation parameters,
 * the console prompt sequence is suppressed and parameters are input
 * from the file.
 *
 * Simulations performed by the program are based on the
 * blanker configuration outlined below. The picture is for a
 * split plate configuration; a single plate configuration is
 * obtained by collapsing the second half of the drawing onto
 * the first, e.g. z1=z2=z3. blanker center (zc=lc) becomes
 * lp/2 in this instance.
 *
 *      |<--------lp-------->|<--lg-->|
 *      |                    |        |
 *      |====================|        |====================|
 *                                lc
 * z=z0 *-------------------------*---------------------------> * z=ze
 *                              z=zc
 *      |====================|        |====================|
 *      |                    |        |                    |
 *      |                    |        |                    |
 *      z=0.0              z=z1      z=z2                 z=z3
 *
 * The program supports several flavors of simulations. These are
 * the following:
 *
 *   applied blanker voltage  - voltage applied to the blanker plates.
 *                              this is approximated by exp(-at)*cos(bt),
 *                              where a,b are supplied by the user
 *
 *   radial deflection        - magnitude of beam deflection (um/volt) as a
 *                              function of time or e- travel distance
 *
 *   deflection angle         - angular beam deflection (mrad/volt) wrt blanker
 *                              center as a function of time/distance
 *
 *   beam jitter              - apparent beam deflection (um/volt) at
 *                              blanker center
 *
```

```
 * Applied blanker voltage simulations produce values between 0 and 1
 * and are intended to permit evaluation of the waveform only.
 *
 * Radial deflection and deflection angle simulations are supported for
 * both steady state conditions (blanker on continuously) and blanker
 * transitions from on -> off and off -> on.
 * Abscissa values for steady state simulations
 * are taken to be the value of the simulation EVALUATED at that
 * position on the axis;  for non-steady-state simulations, the axis
 * value represents the initial position of the electron for which
 * the simulation is performed.  In the latter case, the program user
 * supplies the time/position at which the simulation function is to
 * be evaluated.
 *
 * It should be pointed out that simulations of beam jitter are
 * supported only for the non-steady-state case.
 *
 * The output stream consists of a header and data.  The header section
 * is composed of a line of user-specified title, followed by a line
 * containing user-specified limits of the data in the format
 * "xmin xmax ymin ymax".  The remaining lines of the file consist
 * of floating point x,y pairs, one per line, which represent an axial
 * coordinate and resultant simulation value.
 *
 * The output format is intended to facilitate display of the data using
 * a Unix display pipe "graph | plot -Tdddd", where dddd represents
 * the user's display device.  This provides a primitive but adequate
 * display capability, with axis enumeration, for the simulator.  By
 * embedding the pipe in a csh script, title and limits information may
 * be stripped from the output stream and used to control output processing
 * by the "graph" filter.
 *
 * authored 07/30/89 by P Condran
 *
 * edit       11/02/90 by S Watson    - Adding ability to handle blanker off to
 *                                      on transition.
 *
 */ define SIMPTS    100                /* number of points in simulation */
define QE        1.602e-19          /* electron charge in Coulombs */
#define ME        9.108e-31          /* electron mass in kg */
#define C         2.9979e+08         /* speed of light in m/sec */
#define MM_NS     1.0e-6             /* MKS to mm/nsec conversion */
define MILLI     1000.0             /* microns (mrad) per mm (rad) conversion */ void i_ss_func(/* blk_p,sim_p */);        /* ss module initialization */
void i_pd_func(/* blk_p,sim_p */);        /* pd module initialization */
int get_sim_p(/* TTYin,TTYout,&blk_p,&sim_p,&dis_p,dialog */); /* parameters */
float v_func(/* a,b,t,blk_p.transition */);       /* volt */
float ss_func(/* z,zregion,sim_p.s_type,blk_p.conf */);  /* mm | rad/volt */
float pd_def_x(/* z,zreg,blk_p */);               /* mm/volt */
float pd_def_t(/* z,zreg,blk_p */);               /* rad/volt */
float pd_def_xc(/* z,zreg,zzd,zzdreg,blk_p */);   /* mm/volt */ main(argc,argv)

int argc;
char *argv[];

{
  FILE *TTYin,*TTYout;

struct blankerparm blk_p;
  struct simparm sim_p;
  struct displayparm dis_p;

enum boolean dialog;              /* true if input is not a file */
```

```c
float qeVb,Vz;                      /* axial velocity */
float zr[6];                        /* blanker region endpoints */ float zmin,zmax;                    /* simulation bounds in mm */
float zd;                           /* propagation delay in mm e travel */ int zreg,zzdreg;                    /* blanker region for undelayed and */
                                    /* delayed electron */ float z,zstep;                      /* z coordinate and loop increment */
float zzd;                          /* initial position + propagation delay */ int i;
float f;                            /* simulation value at z (or t) */ if (argc > 1)
{
  if ((TTYin = fopen(*++argv,"r")) == NULL)
  {
    fprintf(stderr,"Cannot FOPEN input file %s\n",*argv);
    return 1;
  }
  dialog = false; /* suppress dialog; get parameters from file */
}
else
{
  TTYin = stdin;
  dialog = true;   /* query user for parameters */
} if ((TTYout = fopen(ctermid((char *) NULL),"a")) == NULL)
{
  fprintf(stderr,"Cannot FOPEN controlling terminal\n");
  return 1;
}

/* get simulation parameters and output header information */ get_sim_p(TTYin,TTYout,&blk_p,&sim_p,&dis_p,dialog);

printf("%s\n",dis_p.title);
printf("%f %f %f %f\n",dis_p.x1,dis_p.x2,dis_p.y1,dis_p.y2);

/* compute axial electron velocity, Vz, from beam voltage */ qeVb=QE*sim_p.v_beam / (2.0*ME*C*C);
Vz=(2.0*C*sqrt(qeVb*(1.0+qeVb))/(1.0+2.0*qeVb)) * MM_NS; /* mm/nsec */

/* set blanker and beam characteristics */ zr[1] = 0.0;                                           /* pre-entry */
if (blk_p.conf == simple)
  zr[2] = zr[3] = zr[4] = blk_p.l_plate;               /* simple blanker */
else
{                                                      /* split plate blanker */
  zr[2] = blk_p.l_plate / 2.0;                         /* first plate */
  zr[3] = blk_p.l_plate / 2.0 + blk_p.l_gap;           /* drift region */
  zr[4] = blk_p.l_plate + blk_p.l_gap;                 /* second plate */
}
zr[5] = MAXFLOAT;                                      /* post-exit */

/* convert tmax to zmin, tmin to zmax */ if (dis_p.x_unit == nsec)
{
  zmin = Vz*(-dis_p.x2);
  zmax = Vz*(-dis_p.x1);
  zd   = Vz*(blk_p.delay);
}
```

```
    else
    {
      zmin = dis_p.x1;
      zmax = dis_p.x2;
      zd   = blk_p.delay;
    }

/* perform initialization */ if (sim_p.s_type != vtrace)
      if (sim_p.s_state)
        i_ss_func(blk_p,sim_p);
      else
        i_pd_func(blk_p,sim_p,dis_p,Vz);

zstep = (zmax-zmin)/((float) SIMPTS);

/* perform simulation and write results to output file */ for (i=0,z=zmin,zzd=zmin+zd,zreg=zzdreg=1;
         i < SIMPTS;
         i++,z+=zstep,zzd+=zstep)
    {
      while (z > zr[zreg])
        zreg++;
      while (zzd > zr[zzdreg])
        zzdreg++;
      if (sim_p.s_type == vtrace)
        f=v_func(sim_p.a,sim_p.b,z/Vz,blk_p.trans);        /* volt */
      else
        if (sim_p.s_state)
          f=MILLI*ss_func(z,zreg,sim_p.s_type,blk_p.conf); /* um | mrad / volt */
        else
          switch (sim_p.s_type)
          {
            case defx:
              f=MILLI*pd_def_x(z,zreg,blk_p);              /* um/volt */
              break;
            case deft:
              f=MILLI*pd_def_t(z,zreg,blk_p);              /* mrad/volt */
              break;
            case appdefx:
              f=MILLI*pd_def_xc(z,zreg,zzd,zzdreg,blk_p);  /* um/volt */
              break;
            default:
              break;
          }  /* end switch simulation type */ printf("%f %f\n",(dis_p.x_unit == mm) ? z : -z/Vz,f);
    } fclose(TTYin); fclose(TTYout);
    return 0;
}
        i_ss_func(blk_p,sim_p);
      else
        i_pd_func(blk_p,sim_p,dis_p,Vz);

zstep = (zmax-zmin)/((float) SIMPTS);

/* perform simulation and write results to output file */ for (i=0,z=zmin,zzd=zmin+zd,zreg=zzdreg=1;
         i < SIMPTS;
         i++,z+=zstep,zzd+=zstep)
    {
      while (z > zr[zreg])
        zreg++;
      while (zzd > zr[zzdreg])
        zzdreg++;
```

```
    if (sim_p.s_type == vtrace)
      f=v_func(sim_p.a,sim_p.b,z/Vz,blk_p.trans);            /* volt */
    else
      if (sim_p.s_state)
        f=MILLI*ss_func(z,zreg,sim_p.s_type,blk_p.conf); /* um | mrad / volt */
      else
        switch (sim_p.s_type)
        {
          case defx:
            f=MILLI*pd_def_x(z,zreg,blk_p);                  /* um/volt */
            break;
          case deft:
            f=MILLI*pd_def_t(z,zreg,blk_p);                  /* mrad/volt */
            break;
          case appdefx:
            f=MILLI*pd_def_xc(z,zreg,zzd,zzdreg,blk_p);      /* um/volt */
            break;
          default:
            break;
        } /* end switch simulation type */ printf("%f %f\n",(dis_p.x_unit == mm) ? z : -z/Vz,f);
  } fclose(TTYin); fclose(TTYout);
  return 0;
} include <ctype.h>
include <stdio.h>
#include <string.h>
#include "comtyp.h"
#include "m4blksim.h"

/*
 * MEBES IV BLanKer SIMulation program - simulation parameter input module
 *
 * Simulations performed by the program are based on the
 * blanker configuration outlined below. The picture is for a
 * split plate configuration; a single plate configuration is
 * obtained by collapsing the second half of the drawing onto
 * the first, e.g. z1=z2=z3. blanker center (zc=lc) becomes
 * lp/2 in this instance.
 *
 *        |<--------lp-------->|<--lg-->|
 *        |                    |        |
 *        |====================|        |================|
 *                             lc
 * z=z0 *----------------------*---------------------------> * z=ze
 *                             z=zc
 *        |====================|        |================|
 *        |                    |        |                |
 *        |                    |        |                |
 *        z=0.0                z=z1     z=z2             z=z3
 *
 * input query sequence is
 *
 ****************************************************************
 *
 * Select output profile:
 *
 *   1 - deflection voltage       2 - deflection radius
 *   3 - deflection angle         4 - apparent deflection at blanker center
 *
 * Steady state simulation? Y//
 *
 * Enter abscissa units (1 - mm, 2 - nsec): 1//
 *
 * Enter beam voltage (eV):
 *
```

```
* Blanker on -> off transition? Y//
*
* Enter voltage modulation parameters (1/sec):              (vtrace and -ss)
*
* Enter plate length, separation, and interplate gap (mm):  (-vtrace)
*
* Enter propagation delay and units (nsec | mm):            (-vtrace)
*
* Evaluate function at what axial position? (nsec/mm):      (defx,deft -ss)
*
* Display limits:
*    Abscissa (low, high) (nsec | mm):
*    Ordinate (low, high) (volt | um/volt | mrad/volt):
*
* Title (c80):
*
********************************************************************
*
* The query sequence is highly dependent on informational needs of the
* simulator.  Questions may be eliminated from the dialog whenever the
* program logic determines they are unnecessary.
*
* authored 7/14/89 by P Condran
* edit     7/30/89 by P Condran - suppressed prompt text if TTYin is
*                                 not a terminal device
* edit     8/04/89 by P Condran - corrected fault in steady state query
* edit    10/03/89 by P Condran - added evaluation point prompt
*                                 to accommodate general case computation
*                                 of apparent deflection ("jitter") in
*                                 split plate blanker configuration
* edit    11/02/90 by S Watson  - add prompt for type of blanker transition;
*                                 on -> off or off -> on.
*/ define PROMPTLINE 80 void prompt(/* FILE TTYout, char s[PROMPTLINE] */ );
char *ttyname(/* ttyvar */);

int get_sim_p(TTYin,TTYout,blk_p,sim_p,dis_p,dialog)

FILE *TTYin,*TTYout;                    /* input/output files for dialog */ struct blankerparm *blk_p;              /* blanker configuration parameters */
struct simparm *sim_p;                  /* simulation parameters */
struct displayparm *dis_p;              /* display limits, axis units, etc */ enum boolean dialog;                    /* false if input from a file */
                                        /* suppresses prompting */
{
  int n;
  char c,s[2];
  char l[TTYLINE];                      /* used to read TTY input */
  char s1[PROMPTLINE],s2[PROMPTLINE];   /* used to contruct prompts */
  char *nlp;
  float a,b,p,d,g,xmin,xmax,ymin,ymax,v,z; /* temps */ static char *x_unit_text[] = {"mm","nsec"};
  static char *y_unit_text[] = {"volts","um/volt","mrad/volt","um/volt"};

blk_p->conf  = simple;                /* default blanker configuration */
  blk_p->trans = on_off;                /* default blanker transition */
  sim_p->v_beam = 10000;                /* default beam voltage to 10kev */
  sim_p->s_type  = vtrace;              /* default simulation type */
  dis_p->x_unit = mm;                   /* default abscissa units */ if (dialog)
  {
    fprintf(TTYout,"Select output profile:\n\n");
```

```
      fprintf(TTYout,"  1 - deflection voltage  2 - deflection radius\n");
      fprintf(TTYout,"  3 - deflection angle    4 - apparent deflection\n");
      prompt(TTYout,"\nSelect: 1// ");
   } while (fgets(l,TTYLINE,TTYin) != NULL && sscanf(l,"%d",&n) > 0)
      if (n - 1 >= (int) vtrace && n - 1 <= (int) appdefx)
      {
         sim_p->s_type = (enum simtype) (n - 1);
         break;
      }
      else
         prompt(TTYout,sprintf(sl,"Invalid profile -- %d.  Enter type: 1// ",n));

if (sim_p->s_type != vtrace && sim_p->s_type != appdefx)
   {
      sim_p->s_state = true; /* steady state is default */ if (dialog)
         prompt(TTYout,"Steady state simulation? Y// ");
      while (fgets(l,TTYLINE,TTYin) != NULL && sscanf(l,"%1s",s) > 0)
      {
         switch (c = (isupper(s[0])) ? s[0] : (char) toupper(s[0]))
         {
         case 'Y':
            sim_p->s_state = true;
            break;
         case 'N':
            sim_p->s_state = false;
            break;
         default:
            prompt(TTYout,
                   sprintf(sl,"Invalid response -- %c.  Response: Y// ",c));
            continue;
         }
         break;
      }
   }
   else
      sim_p->s_state = false; /* steady state not supported */ if (dialog)
      prompt(TTYout,"Enter abscissa units (1 - mm, 2 - nsec): 1// ");

while (fgets(l,TTYLINE,TTYin) != NULL && sscanf(l,"%d",&n) > 0)
      if (n - 1 >= (int) mm && n - 1 <= (int) nsec)
      {
         dis_p->x_unit = (enum axisunit) (n - 1);
         break;
      }
      else
         prompt(TTYout,sprintf(sl,"Invalid units -- %d.  Enter units: 1// ",n));

if (dialog)
      prompt(TTYout,"Enter beam voltage (eV): 10000//");

while (fgets(l,TTYLINE,TTYin) != NULL && sscanf(l,"%f",&v) > 0)
   {
      if (v > 0.0)
      {
         sim_p->v_beam = v;
         break;
      }
      else
         prompt(TTYout,"Enter voltage: ");
   } if ((sim_p->s_type == vtrace) || (! sim_p->s_state))
   {
```

```c
    if (dialog)
      prompt(TTYout,"Blanker on -> off transition? Y/N ");

while (fgets(1,TTYLINE,TTYin) != NULL && sscanf(1,"%1s",s) > 0)
    {
      switch (c = (isupper(s[0])) ? s[0] : (char) toupper(s[0]))
      {
      case 'Y':
        blk_p->trans = on_off;
        break;
      case 'N':
        blk_p->trans = off_on;
        break;
      default:
        prompt(TTYout,
               sprintf(s1,"Invalid response -- %c.  Response: Y/N ",c));
        continue;
      }
      break;
    }
  } if ((sim_p->s_type == vtrace) || (! sim_p->s_state))
  {
    if (dialog)
      prompt(TTYout,"Enter voltage modulation parameters a,b (1/nsec): ");

while (fgets(1,TTYLINE,TTYin) == NULL || sscanf(1,"%f%f",&a,&b) < 2)
      prompt(TTYout,"Enter voltage parameters: ");

sim_p->a = a;
    sim_p->b = b;
  } if (sim_p->s_type != vtrace)
  {
    if (dialog)
      prompt(TTYout,"Enter plate length, separation, and gap (mm): ");

while (fgets(1,TTYLINE,TTYin) == NULL || sscanf(1,"%f%f",&p,&d) < 2)
      prompt(TTYout,"Enter blanker parameters: ");

blk_p->conf = (sscanf(1,"%*f%*f%f",&g) > 0 && g > 0.0) ? split : simple;
    blk_p->l_plate = p;
    blk_p->d_sep = d;
    blk_p->l_gap = g;

if (blk_p->conf == simple)
      blk_p->delay = 0.0;
    else
    {
      if (dialog)
      {
        sprintf(s1,"Enter propagation delay ");
        strcat(s1,sprintf(s2,"(%s): ",x_unit_text[(int) dis_p->x_unit]));
        prompt(TTYout,s1);
      } while (fgets(1,TTYLINE,TTYin) == NULL || sscanf(1,"%f",&z) <= 0)
        prompt(TTYout,"Enter delay value: ");
      blk_p->delay = z;
    } if ((! sim_p->s_state) && (sim_p->s_type != vtrace))
/*    if (! ((sim_p->s_type == appdefx) && (blk_p->conf == simple))) */
    {
      if (dialog)
      {
        sprintf(s1,"Evaluate function at what axial position? ");
```

```
      strcat(s1,sprintf(s2,"(%s): ",x_unit_text[(int) dis_p->x_unit]));
      prompt(TTYout,s1);
    } while (fgets(1,TTYLINE,TTYin) == NULL || sscanf(1,"%f",&z) <= 0)
      prompt(TTYout,"Enter evaluation position: ");
    sim_p->e_point = z;
  }
} if (dialog)
{
  fprintf(TTYout,"Enter display limits:\n");
  sprintf(s1,"  abscissa (low, high) ");
  strcat(s1,sprintf(s2,"(%s): ",x_unit_text[(int) dis_p->x_unit]));
  prompt(TTYout,s1);
} while (fgets(1,TTYLINE,TTYin) == NULL || sscanf(1,"%f%f",&xmin,&xmax) < 2)
  prompt(TTYout,"Enter abscissa limits: ");

if (dialog)
{
  sprintf(s1,"  ordinate (low, high) ");
  strcat(s1,sprintf(s2,"(%s): ",y_unit_text[(int) sim_p->s_type]));
  prompt(TTYout,s1);
} while (fgets(1,TTYLINE,TTYin) == NULL || sscanf(1,"%f%f",&ymin,&ymax) < 2)
  prompt(TTYout,"Enter ordinate limits: ");

dis_p->x1 = xmin; dis_p->x2 = xmax;
dis_p->y1 = ymin; dis_p->y2 = ymax;

if (dialog)
  prompt(TTYout,"Enter display title (c80): ");

strcpy(dis_p->title,fgets(1,TTYLINE,TTYin));     /* includes newline, so  */
if ((nlp = strchr(dis_p->title,'\n')) != NULL)   /* remove it if necessary */
  *nlp = '\0';

return 0;
} void prompt(TTYout,s)

char *s;

{
  fprintf(TTYout,"%s",s); fflush(TTYout);
} include "math.h"
include "comtyp.h"
#include "m4blksim.h"

/* position dependent blanker behavior simulation routines    */

/* the following static variable declarations are based on the */
/* blanker configuration outlined below.  The picture is for a */
/* split plate configuration;  a single plate configuration is */
/* obtained by collapsing the second half of the drawing onto  */
/* the first, e.g. z1=z2=z3.  blanker center (zc=1c) becomes   */
/* lp/2 in this instance.                                      */

/*
```

```
       |<---------lp-------->|<--lg-->|
       |                     |        |
       |---------------------|        |---------------------|
                                   lc
z=z0 *-------------------------------*---------------------------------> * z=ze
                                  z=zc
       |---------------------|        |---------------------|
       |                     |        |                     |
       |                     |        |                     |
       |                     |        |                     |
      z=0.0                z=z1     z=z2                  z=z3
*/ define ALIM        10.0                /* limit beyond which acot(arg)=arg */ static float Vb;                        /* beam voltage */ static float d,lp,lg;                   /* plate separation, length, and gap */
static float lc,lhg;                    /* blanker center and 1/2 gap */
static float z1,z2,z3,zc,zhg;           /* blanker z's and 1/2 gap distance */
static float zd;                        /* propagation delay in mm e travel */
static float ze;                        /* function evaluation z coordinate */
static float dz1,dz2,dz3;               /* distance from evaluation point */
                                        /* to z1, z2, and z3 */

/* simulation function coefficients - key = Cabc, where         */
/*   a = (x)-deflection, (t)heta, or (a)pparent deflection,     */
/*   b = (n)egative z, (p)ositive z, or (a)ll z                 */
/*   c = (c)osine or (s)ine coefficient                         */ static double Cxnc,Cxns;                /* defx coefficients, z<0 */
static double Cxpc,Cxps;                /* defx coefficients, 0<z0<lp */ static double Ctnc,Ctns;                /* deft simulation coefficients */
static double Canc,Cans;                /* appdefx simulation coefficients */
static double Capc,Caps;                /* appdefx simulation coefficients */ static float A,B,sA2B2,s2A2B2,dA2B2;    /* useful constants */ float ss_func(/* z,zregion,sim_p.s_type,blk_p.conf */); /* mm | rad/volt */

/********************************************************************/

/* initializes parameters used in position dependent blanker simulations */

/*
 * authored  07/18/89 by P Condran
 * edit      11/02/89 by P Condran - added initialization of Cxpc, Cxps,
 *                                   and dz3 for position dependent case
 *                                   lp < ze per MG function derivation
 * edit      11/03/89 by P Condran - set evaluation point for appdefx simple
 *                                   parallel plate case to plate midpoint
 * edit      11/02/90 by S Watson  - handle the additional case of blanker
 *                                   off to on transitions.
 * edit      11/14/90 by S Watson  - fix apparent deflection for simple
 *                                   on->off transitions
 */ void i_pd_func(blk_p,sim_p,dis_p,Vz)

struct blankerparm blk_p;               /* blanker configuration */
struct simparm sim_p;                   /* simulation parameters */
struct displayparm dis_p;               /* display parameters */
float Vz;                               /* axial velocity of electron beam */

{
  double c1,c2;

Vb = sim_p.v_beam;                    /* beam voltage */
  d  = blk_p.d_sep;                     /* plate separation */
```

```
if (blk_p.conf == simple)                /* plate length */
{
  z1 = z2 = z3 = lp = blk_p.l_plate;     /* simple blanker */
  lg = 0.0;
  zc = lc - lp/2.0;
}
else
{
  z1 = lp = blk_p.l_plate / 2.0;         /* split plate blanker */
  lg = blk_p.l_gap;
  z2 = lp + lg;
  z3 = 2.0*lp + lg;
  zc = lc - lp + lg/2.0;
}
zhg = lhg = 0.5*lg;                      /* 1/2 blanker gap */ if (dis_p.x_unit == nsec)
{
  ze = -Vz*(sim_p.e_point);              /* evaluation point must reflect */
  zd =  Vz*(blk_p.delay);                /* reversed time axis */
}
else
{
  ze = sim_p.e_point;
  zd = blk_p.delay;
} dz1 = ze - z1;                           /* distance from end of 1st plate */
                                         /* to evaluation point */
dz2 = ze - z2;                           /* distance from start of 2nd plate */
                                         /* to evaluation point */
dz3 = ze - z3;                           /* distance from end of 2nd plate */
                                         /* to evaluation point */
A=sim_p.a/Vz;
B=sim_p.b/Vz;
sA2B2=A*A + B*B;
s2A2B2=sA2B2*sA2B2;
dA2B2=A*A - B*B;

/* coefficients for deflection sensitivity simulation (z < 0) */ c1=dA2B2 - A*dz3*sA2B2;
c2=B*(dz3*sA2B2 - 2.0*A);
Cxnc=exp(-A*lp)*(c1*cos(B*lp) + c2*sin(B*lp)) - (dA2B2 - A*ze*sA2B2);
Cxns=exp(-A*lp)*(c1*sin(B*lp) - c2*cos(B*lp)) + B*(ze*sA2B2-2.0*A);

/* coefficients for deflection sensitivity simulation (0 < z < lp) */

Cxpc=dA2B2 - A*dz3*sA2B2;
Cxps=B*(dz3*sA2B2 - 2.0*A);

/* coefficients for deflection angle simulation (z < 0) */

Ctnc=A+exp(-A*ze)*(B*sin(B*ze)-A*cos(B*ze));
Ctns=B-exp(-A*ze)*(A*sin(B*ze)+B*cos(B*ze));

/* coefficients for apparent sensitivity (blanker center) simulation */ c1=exp(-A*lp)*(dA2B2+0.5*A*lp*sA2B2);
c2=exp(-A*lp)*(2.0*A*B+0.5*B*lp*sA2B2);
Canc=c1*cos(B*lp)-c2*sin(B*lp)-dA2B2+0.5*A*lp*sA2B2;
Cans=c2*cos(B*lp)+c1*sin(B*lp)-2.0*A*B+0.5*B*lp*sA2B2;
Capc=c1;
Caps=c2;

return;
}

/*************************************************************************/
```

/* computes position-dependent deflection sensitivity function value */

```
/*
 * authored  07/18/89 by P Condran
 * edit      10/09/89 by P Condran - added function=0 for ze < 0.0 (prior
 *                                   to blanker entry)
 *                                 - set function to steady state value for
 *                                   z > lp in simple blanker configuration
 * edit      10/13/89 by P Condran - added check for ze >= z0; else f = 0.0
 * edit      11/02/89 by P Condran - modified for case lp < ze per MG
 *                                   function derivation
 *                                   added initialization of dz1, dz2, and dz3
 *                                   used in split plate beam jitter
 *                                   simulation
 * edit      11/02/90 by S Watson  - handle the additional case of blanker
 *                                   off to on transitions.
 */ float pd_def_x(z0,z0_region,blk_p)

float z0;                    /* initial electron z coordinate */
int z0_region;               /* corresponding blanker z region */
struct blankerparm blk_p;    /* blanker configuration */

{
  double f;                  /* simulation value at ze */
  float xlp, vlp;            /* position, velocity at end of plate */
  float dz = ze - z0;        /* z - initial position to evaluation point */
  float dz0 = z0 - lp;       /* z - end of plate to initial position */ if (ze > 0.0 && ze >= z0)
    switch (blk_p.conf)
    {
      case simple:
        switch (blk_p.trans)
        {
          /* As of 11/2/90, I believe on_off case doesn't handle ze < lp
             correctly.  Only ze > lp is done here */
          case on_off:
            if (z0 < 0.0)
              f = exp(A*z0)*(Cxnc*cos(B*z0)+Cxns*sin(B*z0))/s2A2B2;
            else
              if (z0 < lp)
                f = exp(A*dz0)*(Cxpc*cos(B*dz0)-Cxps*sin(B*dz0))/s2A2B2 -
                    dA2B2/s2A2B2 + A*dz/sA2B2 + z0*ze - z0*z0/2.0;
              else
                f = (ze-lp/2.0)*lp;
            f = f/(2.0*Vb*d);   /* deflection per volt */
            break;

/* off to on case added 11/2/90 */
          case off_on:

/* first handle the case of blanker transition started before
               electron enters blanker */
            if (z0 < 0.0)
            {
              if ((ze < lp) && (ze >= 0.0)) /* evaluation in the blanker */
                f = ze*ze/2 + exp(A*z0)/s2A2B2*(
                    (dA2B2     - ze*A*sA2B2)*cos(-B*z0) +
                    ((-2*A*B)  + ze*B*sA2B2)*sin(-B*z0) +
                    exp(-A*ze)*(-dA2B2*cos(B*dz) + 2*A*B*sin(B*dz)) );
              if (ze >= lp) /* evaluation after blanker */
                         /* calculate x = x(lp) + v(lp)*(z-lp) */
              {
                xlp = lp*lp/2 + exp(A*z0)/s2A2B2*(
                    (dA2B2     - lp*A*sA2B2)*cos(-B*z0) +
                    ((-2*A*B)  + lp*B*sA2B2)*sin(-B*z0) +
                    exp(-A*lp)*(-dA2B2*cos(B*(-dz0))+2*A*B*sin(B*(-dz0))));
```

```
                vlp = lp + exp(A*z0)/sA2B2*(-A*cos(-B*z0) + B*sin(-B*z0) +
                    exp(-A*lp)*(A*cos(B*(-dz0)) - B*sin(B*(-dz0))) );
                f = xlp + vlp*(ze - lp);
                }
            }

/* handle the case of blanker transition started while
               electron is in the blanker */
            if ((z0 >= 0.0) && (z0 <= lp))
            {
              if ((ze <= 0.0) || (ze <= z0))
                f = 0.0;
              if ((ze < lp) && (ze > z0)) /* evaluation in the blanker */
                f = ze*ze/2 - ze*z0 + z0*z0/2 + A*(-dz)/sA2B2 +
                    (1/s2A2B2)*(dA2B2 +
                    exp(A*(-dz))*(-dA2B2*cos(B*dz) + 2*A*B*sin(B*dz)));
              if (ze >= lp) /* evaluation after blanker */
                            /* calculate x = x(lp) + v(lp)*(z-lp) */
              {
                xlp = lp*lp/2 - lp*z0 + z0*z0/2 + A*(dz0)/sA2B2 +
                    (1/s2A2B2)*(dA2B2 +
                    exp(A*dz0)*(-dA2B2*cos(B*(-dz0)) + 2*A*B*sin(B*(-dz0))));
                vlp = lp - z0 + (1/sA2B2)*(-A +
                    exp(A*dz0)*(A*cos(B*(-dz0)) - B*sin(B*(-dz0))) );
                f = xlp + vlp*(ze - lp);
                }
            }

/* handle the case of blanker transition started after
               the electron exits the blanker */
            if (z0 >= lp)
              f = 0.0;

f = f/(2.0*Vb*d);  /* deflection per volt */
            break;

default:
            f = 0.0;
            break;
        }
        break;

case split:
        f=0.0; /* not supported */
        break;

default:
        f=0.0;
        break;
    } /* end switch blanker configuration */
  else
    f=0.0;

return (float) f;
}
/******************************************************************/

/* computes electron position dependent angle simulation function value */

/*
 * authored   07/18/89 by P Condran
 * edit       10/09/89 by P Condran - added function=0 for ze < 0.0 (prior
 *                                    to blanker entry)
 *                                  - set function to steady state value for
 *                                    z > lp in simple blanker configuration
 * edit       10/13/89 by P Condran - added check for ze >= z0; else f = 0.0
 * edit       11/??/90 by S Watson  - handle the additional case of blanker
 *                                    off to on transitions.
 */
```

```c
float pd_def_t(z0,z0_region,blk_p)

float z0;                       /* initial electron z coordinate */
int z0_region;                  /* corresponding blanker z region */
struct blankerparm blk_p;       /* blanker configuration */

{
  double f;                     /* simulation value at ze */
  float dz = ze - z0;           /* z traversed since blanker entry */ if (ze > 0.0 && ze >= z0)
    switch (blk_p.conf)
    {
    case simple:
      switch (z0_region)        /* initial region */
      {
      case 1:                   /* pre-entry */
        f = exp(A*z0)*(Ctnc*cos(B*z0)+Ctns*sin(B*z0))/sA2B2;
        break;
      case 2:                   /* in plate region */
      case 3:
      case 4:
        f = z0+(A+exp(-A*dz)*(B*sin(B*dz)-A*cos(B*dz)))/sA2B2;
        break;
      case 5:                   /* post-exit */
        f = lp;                 /* steady state behavior */
        break;
      default:
        f = 0.0;
        break;
      }

/* convert radial deflection to deflection angle argument */ f = f/(2.0*Vb*d);  /* deflection angle per volt */
      break;

case split:
      f = 0.0; /* not supported */
      break;

default:
      f = 0.0;
      break;
    } /* end switch blanker configuration */
  else
    f=0.0;

return (float) f;
}

/*******************************************************************/

/* computes position dependent apparent deflection at blanker center */

/*
 * authored 07/18/89 by P Condran
 * edit     08/09/89 by P Condran  - corrected (z0reg=2,zzdreg=4) computation
 *                                   to use zc instead of zhg for (lp+lg/2)
 * edit     09/05/89 by P Condran  - added function value = 0 for z0 > lp
 *                                   in simple plate case
 * edit     11/02/89 by P Condran  - modified for more general formulation
 *                                   derived by MG for split plate assembly
 * edit     11/06/90 by S Watson   - handle the additional case of blanker
 *                                   off to on transitions.
 * edit     11/08/90 by S Watson   - modify simple on->off transition to
 *                                   handle arbirtrary evaluation point.
 */
```

```
float pd_def_xc(z0,z0_region,zzd,zzd_region,blk_p)

float z0;                    /* initial electron z coordinate */
float zzd;                   /* electron coordinate after prop delay zd */
int z0_region;               /* corresponding blanker z region */
int zzd_region;              /* z region after prop delay distance zd */
struct blankerparm blk_p;    /* blanker configuration */

{
  double f;                  /* simulation value at ze */
  float dz = ze - z0;        /* z traversed since blanker entry */ double sbsf(/* r,z */);

switch (blk_p.conf)
  {
  case simple:
    switch (blk_p.trans)
    {
      /* handle the on->off first.  As of 11/8/90, this calculates */
      /* apparent deflection at arbirtrary evaluation point */
      case on_off:
        if (z0 < 0.0)
          f = sbsf(dz1,z1-z0) - sbsf(ze,-z0);
        else
          if (z0 < lp)
            f = -z0*z0/2.0 + z0*ze - dA2B2/s2A2B2 + (ze-z0)*A/sA2B2 +
                sbsf(dz1,z1-z0);
          else
            f = lp * (ze - lp/2);
        break;
      /* the off->on case added 11/6/90 */
      case off_on:
        if (z0 < 0.0)
          f = -(lp*lp)/2.0 + ze*lp + sbsf(ze,-z0) - sbsf(dz1,z1-z0);
        else
          if (z0 < lp)
            f = z0*z0/2.0 - z1*z1/2.0 + ze*(z1-z0-A/sA2B2) + dA2B2/s2A2B2 +
                z0*A/sA2B2 - sbsf(dz1,z1-z0);
          else
            f = 0.0;
        break;

default:
        f = 0.0;
        break;
    } f = f/(2.0*Vb*d);  /* apparent deflection per volt */
    break;

case split:
    switch (blk_p.trans)
    {
     /* handle the on->off first. */
     case on_off:
       switch (z0_region)                          /* initial region */
       {
        case 1:                            /* initially at pre-entry */
          switch (zzd_region)              /* region after propagation delay */
          {
            case 1:                        /* prior to end of 1st plate */
            case 2:
            case 3:
              f = sbsf(dz3,z3-zzd) -
                  sbsf(dz2,z2-zzd) +
                  sbsf(dz1,z1-z0) -
                  sbsf(ze,-z0);
            break;
```

```
      case 4:                       /* in drift region */
        f = sbsf(dz3,z3-zzd) +
            0.5*(z2*z2-zzd*zzd) +
            sbsf(dz1,z1-z0) -
            sbsf(ze,-z0) -
            dA2B2/s2A2B2 + A*(ze-zzd)/sA2B2 -
            ze*(z2-zzd);
        break;
      case 5:                       /* post-exit */
        f = sbsf(dz1,z1-z0) -
            sbsf(ze,-z0) +
            z1*(ze-z3+0.5*z1);
        break;
      default:
        f = 0.0;
        break;
      } /* end switch zdd region for z0 region 1 */
    break;

case 2:                           /* initially in 1st plate region */
    switch (zzd_region)             /* region after propagation delay */
    {
      case 1:                       /* prior to end of 1st plate */
      case 2:
      case 3:
        f = sbsf(dz3,z3-zzd) -
            sbsf(dz2,z2-zzd) +
            sbsf(dz1,z1-z0) -
            0.5*z0*z0 + z0*ze +
            A*(ze-z0)/sA2B2 - dA2B2/s2A2B2;
        break;
      case 4:                       /* in drift region */
        f = sbsf(dz3,z3-zzd) +
            sbsf(dz1,z1-z0) +
            0.5*(z2*z2-zzd*zzd) -
            0.5*z0*z0 + ze*(2.0*z0+zd-z2) -
            2.0*dA2B2/s2A2B2 + A*(2.0*ze-2.0*z0-zd)/sA2B2;
        break;
      case 5:                       /* post-exit */
        f = sbsf(dz1,z1-z0) +
            z0*ze - 0.5*z0*z0 +
            z1*(0.5*z1+ze-z3) -
            dA2B2/s2A2B2 + A*(ze-z0)/sA2B2;
        break;
      default:
        f = 0.0;
        break;
      } /* end switch zdd region for z0 region 2 */
    break;

case 3:                           /* initial at 1st plate or drift region */
  case 4:
    switch (zzd_region)             /* region after propagation delay */
    {
      case 1:                       /* prior to end of 1st plate */
      case 2:
      case 3:
        f = sbsf(dz3,z3-zzd) -
            sbsf(dz2,z2-zzd) +
            z1*(ze-0.5*z1);
        break;
      case 4:                       /* in drift region */
        f = sbsf(dz3,z3-zzd) +
            (zzd-lg+A/sA2B2)*(ze-zzd) +
            z1*(0.5*z1+lg) -
            0.5*(z2*z2-zzd*zzd) -
            lg*(zzd-z2) - dA2B2/s2A2B2;
        break;
```

```
      case 5:                            /* post-exit */
        f = 2.0*z1*(ze-0.5*z3);
        break;
      default:
        f = 0.0;
        break;
      } /* end switch zdd region for z0 region 3 and 4 */
      break;

case 5:                              /* initial at post-exit */
      f = 0.0;
      break;

default:
      f = 0.0;
      break;
    } /* end switch z0 region for split plate configuration */
    break;

/* handle the blanker off -> on transition */
  case off_on:
    switch (z0_region)                   /* initial region */
    {
      case 1:                            /* initially at pre-entry */
        switch (zzd_region)              /* region after propagation delay */
        {
          case 1:                        /* prior to start of 2nd plate */
          case 2:
          case 3:
            f = 2.0*ze*z1 - z3*z3/2.0 + z2*z2/2.0 - z1*z1/2.0 -
                sbsf(dz3,z3-z0-zd) +
                sbsf(dz2,z2-z0-zd) -
                sbsf(dz1,z1-z0) +
                sbsf(ze,-z0);
            break;
          case 4:                        /* in 2nd plate */
            f = ze*(z3-z0-zd+z1-A/sA2B2) -
                z3*z3/2.0 + (z0+zd)*(z0+zd)/2.0 - z1*z1/2.0 +
                dA2B2/s2A2B2 + A*(z0+zd)/sA2B2 -
                sbsf(dz3,z3-z0-zd) -
                sbsf(dz1,z1-z0) +
                sbsf(ze,-z0);
            break;
          case 5:                        /* post-exit */
            f = ze*z1 - z1*z1/2.0 -
                sbsf(dz1,z1-z0) +
                sbsf(ze,-z0);
            break;
          default:
            f = 0.0;
            break;
        } /* end switch zdd region for z0 region 1 */
        break;

case 2:                            /* initially in 1st plate region */
        switch (zzd_region)              /* region after propagation delay */
        {
          case 1:                        /* prior to start of 2nd plate */
          case 2:
          case 3:
            f = ze*(2.0*z1-z0-A/sA2B2) -
                z3*z3/2.0 + z2*z2/2.0 - z1*z1/2.0 + z0*z0/2.0 +
                dA2B2/s2A2B2 + z0*A/sA2B2 -
                sbsf(dz3,z3-z0-zd) +
                sbsf(dz2,z2-z0-zd) -
                sbsf(dz1,z1-z0);
            break;
          case 4:                        /* in 2nd plate */
            f = ze*(z3-2.0*z0-zd+z1-2.0*A/sA2B2) -
```

```
              z3*z3/2.0 + (z0+zd)*(z0+zd)/2.0 - z1*z1/2.0 + z0*z0/2.0 +
              2.0*dA2B2/s2A2B2 + A*(2.0*z0+zd)/sA2B2 -
              sbsf(dz3,z3-z0-zd) -
              sbsf(dz1,z1-z0);
            break;
          case 5:                          /* post-exit */
            f = ze*(z1-z0-A/sA2B2) +
                z0*z0/2.0 - z1*z1/2.0 +
                dA2B2/s2A2B2 + A*z0/sA2B2 -
                sbsf(dz1,z1-z0);
            break;
          default:
            f = 0.0;
            break;
        } /* end switch zdd region for z0 region 2 */
        break;

case 3:                          /* initial past 1st plate or drift region */
      case 4:
        switch (zzd_region)             /* region after propagation delay */
        {
          case 1:                        /* prior to start of 2nd plate */
          case 2:
          case 3:
            f = ze*z1 - z1*z1/2.0 - z1*z2 -
                sbsf(dz3,z3-z0-zd) +
                sbsf(dz2,z2-z0-zd);
            break;
          case 4:                        /* in 2nd plate */
            f = ze*(z3-z0-zd-A/sA2B2) -
                z3*z3/2.0 + (z0+zd)*(z0+zd)/2.0 +
                dA2B2/s2A2B2 + A*(z0+zd)/sA2B2 -
                sbsf(dz3,z3-z0-zd);
            break;
          case 5:                        /* post-exit */
            f = 0.0;
            break;
          default:
            f = 0.0;
            break;
        } /* end switch zdd region for z0 region 3 and 4 */
        break;

case 5:                          /* initial at post-exit */
        f = 0.0;
        break;

default:
        f = 0.0;
        break;
    } /* end switch z0 region for split plate configuration */
    break;

default:
    f = 0.0;
    break;

} /* end of switch for transition type */ f = f/(2.0*Vb*d); /* apparent shift per volt */
  break;

default:
  f=0.0;
  break;
} /* end switch blanker configuration */ return f;
}
```

/**********************************************************************/

/* split plate blanker support function */

/*
 * used to support computation of apparent beam shift values for
 * a split plate blanker configuration
 *
 * authored 07/18/89 by P Condran
 *
 */

```
double sbsf(r,z)

double r,z;

{
   double f;

f=exp(-A*z)*((dA2B2/sA2B2-A*r)*cos(B*z)+(B*r-2.0*A*B/sA2B2)*sin(B*z))/sA2B2;

return f;
} include <math.h>
include "comtyp.h"
#include "m4blksim.h"
```

/*
 * Simulations performed by the program are based on the
 * blanker configuration outlined below. The picture is for a
 * split plate configuration; a single plate configuration is
 * obtained by collapsing the second half of the drawing onto
 * the first, e.g. z1=z2=z3. blanker center (zc=lc) becomes
 * lp/2 in this instance.
 *
 *         |<--------lp--------->|<--lg-->|
 *         |                     |        |
 *         |---------------------|        |--------------------|
 *                                  lc
 * z=z0 *---------------------------*---------------------------------> * z=ze
 *                                  z=zc
 *         |---------------------|        |--------------------|
 *         |                     |        |                    |
 *         |                     |        |                    |
 *         z=0.0                 z=z1     z=z2                 z=z3
 *
 * This module supports the following simulations:
 *
 *    radial deflection       - magnitude of beam deflection (um/volt) as a
 *                              function of time or e- travel distance
 *
 *    deflection angle        - angular beam deflection (mrad/volt) wrt blanker
 *                              center as a function of time/distance
 *
 * Abscissa values for steady state simulations are taken to be the value
 * of the simulation EVALUATED at that position on the axis
 *
 */

```
#define ALIM       10.0          /* arg limit beyond which acot(arg) = arg */
                                 /* approximation is valid */ static float Vb;                 /* beam voltage */
static float d,lp,lg;            /* plate separation, length, and gap */
static float lc;                 /* blanker center */
```

/* initializes parameters used in steady state blanker simulations */

```c
/*
 * authored 07/17/89 by P Condran
 */ void i_ss_func(blk_p,sim_p)

struct simparm sim_p;
struct blankerparm blk_p;

{
  Vb = sim_p.v_beam;
  if (blk_p.conf == simple)      /* plate length */
  {
    lp = blk_p.l_plate;          /* simple blanker */
    lg = 0.0;                    /* plate gap */
    lc = lp/2.0;                 /* blanker center */
  }
  else
  {
    lp = blk_p.l_plate / 2.0;    /* split plate blanker */
    lg = blk_p.l_gap;            /* plate gap */
    lc = lp + lg/2.0;            /* blanker center */
  } d = blk_p.d_sep;               /* plate separation */ return;
}

/***************************************************************/

/* computes steady state blanker simulation functions */

/*
 * authored 07/17/89 by P Condran
 */ float ss_func(z,zregion,stype,conf)

float z;
int zregion;
enum simtype stype;
enum blankerconfig conf;

{
  float f;

switch (stype)
  {
  case defx:                                 /* radial deflection */
  case deft:                                 /* deflection angle  */
    switch (conf)
    {
    case simple:
      switch (zregion)                       /* evaluate based on position */
      {                                      /* wrt blanker assembly       */
      case 1:                                /* pre-entry */
        f = 0.0;
        break;
      case 2:                                /* within plate region */
      case 3:
      case 4:
        f = (z*z)/(4.0*Vb*d);
        break;
      case 5:                                /* post-exit */
        f = (z-lp/2.0)*lp/(2.0*Vb*d);
        break;
      default:
        break;
      }
```

```
          break;
       case split:
          switch (zregion)
          {
          case 1:                            /* pre-entry */
             f = 0.0;
             break;
          case 2:                            /* within 1st plate region */
             f = (z*z)/(4.0*Vb*d);
             break;
          case 3:                            /* in drift region */
             f = (lp*lp)/(4.0*Vb*d) + (z-lp)*lp/(2.0*Vb*d);
             break;
          case 4:                            /* within 2nd plate region */
             f = ((2.0*z-lp)*lp + pow(z-lp-lg,2.0))/(4.0*Vb*d);
             break;
          case 5:                            /* post-exit */
             f = lp*(z-lp-lg/2.0)/(Vb*d);
             break;
          default:
             break;
          }                                  /* end switch (initial z) */
          break;
       default:
          break;
       }                                     /* end switch (blanker configuration) */

/* convert radial distance to angle argument if beyond critical */
       /* distance from blanker assembly center                        */ if (stype == deft)
          f = (f != 0.0 && (z-lc)/f > ALIM) ? f/(z-lc) : 0.0;  /* rad */
       break;
    default:
       f=0.0;
       break;
    }                                        /* end switch (simulation type) */
    return f;
} include <math.h>
include "comtyp.h"
#include "m4blksim.h"

/* computes voltage signal magnitude at time t according to a damped
 * cosine model
 *
 * applied blanker voltage simulations produce values between 0 and 1
 * and are intended to permit evaluation of the waveform only.
 *
 * authored 07/14/89 by P Condran
 * edit     11/02/90 by S Watson    - handle case of blanker off -> on as
 *                                    well as on -> off
 *
 */ float v_func(a,b,t,trans)

float a,b,t;
enum transtype trans;

{
   float f;
   if (trans == on_off)
      if (t < 0.0)
         f = 1.0;
      else
         f = exp(-a*t)*cos(b*t);
   else
      if (t < 0.0)
```

```
      f = 0.0;
    else
      f = 1.0 - exp(-a*t)*cos(b*t);

return (float) f;
}
```
/* comtyp.h - structures commonly used in most applications */

```
/*
 * authored 06/12/89 by P Condran
 * edit    08/04/89 by P Condran - added boolean enumeration type
 */ struct ipoint          {int x,y;};
struct rpoint          {float x,y;};

struct cplx            {float a,b;};

enum boolean           {false,true};

/* datatypes used for MEBES IV blanker simulation
 *
 * depends on "comtyp.h" for boolean datatype
 *
 * authored 07/03/89 by P Condran
 * edit    08/04/89 by P Condran - moved boolean enum type to comtyp.h
 */ define TTYLINE        80 enum blankerconfig     {simple,split};
enum axisunit          {mm,nsec};
enum simtype           {vtrace,defx,deft,appdefx};
enum transtype         {on_off, off_on};

struct blankerparm
{
enum blankerconfig conf;
enum transtype trans;
float l_plate,l_gap;
float d_sep,delay;
};

struct simparm
{
float v_beam;
float a,b;
enum boolean s_state;
enum simtype s_type;
float e_point;
};

struct displayparm
{
enum axisunit x_unit;
float x1,x2,y1,y2;
char title[TTYLINE];
};
```

We claim:

1. A method of constructing a double-deflection beam blanker having two blanker plates for a predetermined beam voltage comprising:
   (a) choosing a blanker voltage;
   (b) determining a set of geometric parameters of said blanker including a plate length, a distance separating said two plates, and a gap determined by each of said plates;
   (c) choosing a value for an electron drift length of said blanker;
   (d) determining a resulting beam jitter by substituting said value for said electron drift length in a set of trajectory equations;
   (e) if said resulting beam jitter is unacceptable, substituting a new value for said electron drift length in said set of trajectory equations;
   (f) repeating steps (d) and (e) until said resulting beam jitter is minimized;
   (g) determining a delay line length based on steps (a), (b), and (f);
   (h) constructing a prototype of said blanker using said delay line length and said geometric parameters;
   (i) determining a fringe-field effect with said prototype of said blanker;
   (j) determining an effective blanker plate length based on said fringe-field effect;
   (k) determining an optimal delay line length from said formulae for said blanker; and
   (l) constructing said blanker in accordance with steps (a), (b), and (k).

2. A method of claim 1 further comprising the step of positioning two alignment plates above and below said two blanker plates, each of said two alignment plates defining an aperture.

3. A method of claim 2 wherein each of said apertures limits a maximum off-axis beam position.

4. A method of claim 2 wherein said alignment apertures specify a concentricity of a beam stop to a blanker axis.

5. A double-deflection beam blanker having a predetermined blanker voltage to deflect a charged particle beam having a predetermined beam voltage comprising:
   two parallel, spaced apart, U-shaped conducting plates for deflecting said beam, said conducting plates having a plate length, an interplate separation, a gap determined by each of said conducting plates, and a delay line length; and
   a beam stop placed in operative relation to said conducting plates,
   wherein said delay line length which satisfies predetermined trajectory equations minimizes jitter in said beam.

6. A double-deflection beam blanker having a predetermined blanker voltage to deflect a charged particle beam having a predetermined beam voltage comprising:
   two parallel spaced apart conducting plates for deflecting said beam, said conducting plates having a plate length, an interplate separation, a gap determined by each of said conducting plates, and a delay line length; and
   a first alignment plate having an aperture positioned above said conducting plates and a second alignment plate having an aperture positioned below said conducting plates to define a maximum movement of said beam,
   wherein said delay line length is a function of an electron drift length of the beam which minimizes jitter in the beam, and said delay line length is further optimized as a function of a fringe field effect.

* * * * *